United States Patent
Takanohashi et al.

(10) Patent No.: US 9,630,208 B2
(45) Date of Patent: Apr. 25, 2017

(54) COATING COMPOSITION, COATING FILM, LAMINATE, AND PROCESS FOR MANUFACTURING THE LAMINATE

(71) Applicant: Asahi Kasei E-materials Corporation, Tokyo (JP)

(72) Inventors: Hiroaki Takanohashi, Tokyo (JP); Junichi Hirose, Tokyo (JP); Waka Goto, Tokyo (JP); Shuichiro Ogawa, Tokyo (JP); Kentaro Shiraishi, Tokyo (JP)

(73) Assignee: Asahi Kasei E-materials Corporation, Tokyo (JP)

(*) Notice: Subject to any disclaimer, the term of this patent is extended or adjusted under 35 U.S.C. 154(b) by 111 days.

(21) Appl. No.: 14/540,114

(22) Filed: Nov. 13, 2014

(65) Prior Publication Data

US 2015/0079292 A1    Mar. 19, 2015

Related U.S. Application Data

(62) Division of application No. 13/255,413, filed as application No. PCT/JP2010/054111 on Mar. 11, 2010, now Pat. No. 8,916,266.

(30) Foreign Application Priority Data

Mar. 11, 2009 (JP) .................. 2009-058665
Nov. 27, 2009 (JP) .................. 2009-270364
(Continued)

(51) Int. Cl.
 *B05D 3/00* (2006.01)
 *C08F 230/08* (2006.01)
(Continued)

(52) U.S. Cl.
 CPC ............ *B05D 3/007* (2013.01); *C08F 230/08* (2013.01); *C08G 77/20* (2013.01); *C08J 7/045* (2013.01);
(Continued)

(58) Field of Classification Search
 None
 See application file for complete search history.

(56) References Cited

U.S. PATENT DOCUMENTS

2002/0146555 A1* 10/2002 Hattori .................. C03C 17/007
                                                           428/323
2003/0203991 A1    10/2003 Schottman et al.
(Continued)

FOREIGN PATENT DOCUMENTS

CN        1303885 A      7/2001
JP        S62-074452 A   4/1987
(Continued)

OTHER PUBLICATIONS

Machine translation of JP2008-031297, Feb. 2008.*
(Continued)

*Primary Examiner* — Erma Cameron
(74) *Attorney, Agent, or Firm* — Morgan, Lewis & Bockius LLP

(57) ABSTRACT

Provided is a coating composition excellent in antifouling properties, transparency and hydrophilicity, wherein the coating composition contains (A) a metal oxide particle having a number average particle size of 1 nm to 400 nm; and (B) a polymer particle, in which the content of an aqueous-phase component in the component (B), represented by the expression (I), is 20 mass % or less, where (I) (%)=(dry mass of a filtrate obtained by filtering the component (B) at a molecular cutoff of 50,000)×(100–total mass (Continued)

of solid content)/(mass of the filtrate–dry mass of the filtrate)×100/the total mass of solid content.

17 Claims, 3 Drawing Sheets

(30) Foreign Application Priority Data

Nov. 27, 2009 (JP) .................................. 2009-270375
Mar. 2, 2010 (JP) .................................. 2010-045505

(51) Int. Cl.

| | | |
|---|---|---|
| C08G 77/20 | (2006.01) | |
| C08J 7/04 | (2006.01) | |
| C08K 3/22 | (2006.01) | |
| C08K 3/36 | (2006.01) | |
| C09D 5/00 | (2006.01) | |
| C09D 5/02 | (2006.01) | |
| C09D 5/18 | (2006.01) | |
| C09D 7/12 | (2006.01) | |
| F24J 2/48 | (2006.01) | |
| H01L 31/0216 | (2014.01) | |
| H01L 31/048 | (2014.01) | |
| C09D 143/04 | (2006.01) | |
| C09D 147/00 | (2006.01) | |
| G02B 1/10 | (2015.01) | |
| G02B 5/08 | (2006.01) | |
| H02S 40/10 | (2014.01) | |
| H02S 40/20 | (2014.01) | |
| C08F 220/18 | (2006.01) | |
| C08F 222/38 | (2006.01) | |
| C08G 77/00 | (2006.01) | |
| C08K 5/5415 | (2006.01) | |
| C08K 5/5425 | (2006.01) | |

(52) U.S. Cl.
CPC .................. *C08K 3/22* (2013.01); *C08K 3/36* (2013.01); *C09D 5/006* (2013.01); *C09D 5/024* (2013.01); *C09D 5/18* (2013.01); *C09D 7/125* (2013.01); *C09D 7/1225* (2013.01); *C09D 7/1266* (2013.01); *C09D 7/1275* (2013.01); *C09D 143/04* (2013.01); *C09D 147/00* (2013.01); *F24J 2/488* (2013.01); *G02B 1/105* (2013.01); *G02B 5/08* (2013.01); *H01L 31/02167* (2013.01); *H01L 31/048* (2013.01); *H01L 31/0481* (2013.01); *H02S 40/10* (2014.12); *H02S 40/20* (2014.12); *C08F 220/18* (2013.01); *C08F 222/38* (2013.01); *C08G 77/70* (2013.01); *C08J 2369/00* (2013.01); *C08K 5/5415* (2013.01); *C08K 5/5425* (2013.01); *C08K 2003/2241* (2013.01); *Y02E 10/46* (2013.01); *Y02E 10/50* (2013.01); *Y02E 10/52* (2013.01); *Y10T 428/2438* (2015.01); *Y10T 428/24942* (2015.01); *Y10T 428/24975* (2015.01); *Y10T 428/25* (2015.01); *Y10T 428/254* (2015.01); *Y10T 428/256* (2015.01); *Y10T 428/259* (2015.01)

(56) References Cited

U.S. PATENT DOCUMENTS

2007/0106008 A1  5/2007  Onoue et al.
2009/0286068 A1  11/2009  Niguma et al.

FOREIGN PATENT DOCUMENTS

| | | |
|---|---|---|
| JP | S63-037167 A | 2/1988 |
| JP | H02-172535 A | 7/1990 |
| JP | H05-028274 A | 2/1993 |
| JP | H07-024329 A | 1/1995 |
| JP | H08-089799 A | 4/1996 |
| JP | H08-089800 A | 4/1996 |
| JP | H08-089804 A | 4/1996 |
| JP | H08-198061 A | 8/1996 |
| JP | H09-059568 A | 3/1997 |
| JP | H09-248465 A | 9/1997 |
| JP | H10-007940 A | 1/1998 |
| JP | H10-099694 A | 4/1998 |
| JP | H10-114545 A | 5/1998 |
| JP | H10-244165 A | 9/1998 |
| JP | 2002-145609 A | 5/2002 |
| JP | 2002-285097 A | 10/2002 |
| JP | 2002-361767 A | 12/2002 |
| JP | 2003-266606 A | 9/2003 |
| JP | 2004-111577 A | 4/2004 |
| JP | 2004-142161 A | 5/2004 |
| JP | 2005-249982 A | 9/2005 |
| JP | 2006-178041 A | 7/2006 |
| JP | 2008-031297 A | 2/2008 |
| JP | 2008-184611 A | 8/2008 |
| JP | 2008-189884 A | 8/2008 |
| JP | 2008-284408 A | 11/2008 |
| JP | 2009-019072 A | 1/2009 |
| JP | 2009-029893 A | 2/2009 |
| JP | 2009-249592 A | 10/2009 |
| JP | 2009-249595 A | 10/2009 |
| JP | 2009-286659 A | 12/2009 |
| JP | 2009-286859 A | 12/2009 |
| JP | 2010-235676 A | 10/2010 |
| JP | 2010-235678 A | 10/2010 |
| JP | 2010-235680 A | 10/2010 |
| WO | 2005/063899 A1 | 7/2005 |
| WO | 2007/069596 A1 | 6/2007 |
| WO | 2009/129907 A1 | 10/2009 |
| WO | 2009/140493 A1 | 11/2009 |

OTHER PUBLICATIONS

Machine translation of JP2008-284408, Nov. 2008.*
Stober et al., "Controlled Growth of Monodisperse Silica Spheres in the Micron Size Range," Journal of Colloid and Interface Science, 26: 62-69 (1968).
Badley et al., "Surface Modification of Colloidal Silica," Langmuir: American Chemical Society, 6: 792-801 (1990).
Nakahara et al., "Control of Particle Size and Poor Volume of Silica Microsphere," Journal of the Japan Society of Colour Material, 61: 488-496 (1988).
International Preliminary Report on Patentability issued in corresponding International Patent Application PCT/JP2010/054111 mailed Oct. 27, 2011.
Office Action issued in corresponding Chinese Patent Application No. 201080010270.0 dated Apr. 27, 2013.
Supplemental European Search Report issued in corresponding European Patent Application No. 10750899.6 dated Jun. 12, 2012.
International Search Report issued in corresponding International Patent Application No. PCT/JP2010/054111 dated Jun. 11, 2010.

* cited by examiner

COATING COMPOSITION, COATING FILM, LAMINATE, AND PROCESS FOR MANUFACTURING THE LAMINATE

TECHNICAL FIELD

The present invention relates to a coating composition, a coating film, a laminate and a method for manufacturing the laminate. More specifically, the present invention relates to a coating composition, a coating film, a laminate and a method for manufacturing the laminate, and a solar cell module, a reflector device and a solar thermal power generation system using these.

BACKGROUND ART

Recently, environmental consciousness has been increased by a global warming phenomenon and a novel energy system generating no greenhouse gases such as carbon dioxide gas has attracted attention. Environment-friendly recyclable energy such as photovoltaic power generation and wind power generation does not emit gases, which are said to induce global heating, such as carbon dioxide gas, it has been actively studied as clean energy. A solar cell and solar thermal power generation have attracted attention because of excellent safety and easy-to-handle.

As a typical solar thermal power generation method, there are a central system (central tower system), a distributed system (parabolic trough) and a dish/stirling system. In these systems, sunlight is collected to a spot by use of a reflecting mirror and heat of sunlight harvested is converted into electric energy through thermoelectric conversion. While the key point of this system is collecting light without loss, as the factor significantly varying efficiency, a reduction of reflectivity caused by stain of a reflecting mirror is particularly concerned as a problem. Furthermore, a solar cell whose light-receiving surface is protected by a protecting cover formed of glass, a weather-resistant resin film and the like, has an analogous problem of reducing the light transmittance and thus an energy conversion efficiency of the solar cell since the protecting cover is stained with smoke dust during long-term use.

As a technique for preventing surface stain, for example, Patent Literature 1 discloses a technology for forming a surface layer by applying a coating liquid, which contains tungstic acid dissolved in ammonia water and distilled water, onto a layer containing an anatase type titanium oxide, and then baking at 700° C. to obtain a layer formed of tungsten oxide. Furthermore, an attempt to improve antifouling properties and the like by blending not only an inorganic component but also an organic component has been made.

CITATION LIST

Patent Literature

Patent Literature 1: Japanese Patent Application Laid-Open No. 10-114545

SUMMARY OF INVENTION

Technical Problem

However, conventional coating compositions including Patent Literature 1 have much to be improved. The technology disclosed in Patent Literature 1 has a problem of cracking and peeling off easily occurred at a coating film in the case that the resultant coating film is formed on the surface of a large-scale reflecting mirror and the like used in a solar cell module and the like since only inorganic components are blended.

Furthermore, coating compositions containing not only inorganic components but also organic components still have much to be improved with respect to properties such as antifouling properties, transparency and hydrophilicity. Furthermore, in the case that such a coating film is placed under high-temperature conditions such as desert, a problem such as significant reduction of antifouling properties by breeding out of an aqueous-phase component in the surface of the coating film, and the like.

The present invention was made in the aforementioned circumstances, and one object of the present invention is to provide a coating composition excellent in antifouling properties, transparency and hydrophilicity and capable of maintaining surface hydrophilicity even at high temperature.

Solution to Problem

The present inventors have intensively conducted studies with a view to solving the aforementioned problems. As a result, they found that the aforementioned problems can be overcome by preparing a coating composition comprising (A) a metal oxide particle having a number average particle size of 1 nm to 400 nm and (B) a polymer particle and having a predetermined content or less of an aqueous-phase component, and based on the finding, the present invention was achieved.

More specifically, the present invention is as follows:

[1]
A coating composition comprising
(A) a metal oxide particle having a number average particle size of 1 nm to 400 nm, and
(B) a polymer particle,
wherein the content of an aqueous-phase component in the component (B), represented by the following expression (I), is 20 mass % or less:

$$\text{The content of the aqueous-phase component (\%)} = \text{(dry mass of a filtrate obtained by filtering the component } (B) \text{ at a molecular cutoff of } 50{,}000) \times (100 - \text{total mass of solid content})/(\text{mass of the filtrate} - \text{dry mass of the filtrate}) \times 100/\text{the total mass of solid content} \quad (I).$$

[2]
The coating composition according to item [1], wherein the component (B) is a polymer emulsion particle (B1) obtained in a polymerization material solution comprising
a component (b1): a hydrolyzable silicon compound,
a component (b2): a vinyl monomer,
a component (b3): an emulsifier, and
a component (b4): water,
by polymerizing the component (b1) and the component (b2).

[3]
The coating composition according to item [1] or [2], wherein the content of the aqueous-phase component is 15 mass % or less.

[4]
The coating composition according to any one of items [1] to [3], wherein the component (B) has a number average particle size of 10 nm to 800 nm.

[5]
The coating composition according to any one of items [2] to [4], wherein the component (b2) is a vinyl monomer having at least one functional group selected from the group consisting of a hydroxy group, a carboxyl group, an amide group, an amino group and an ether group.

[6]

The coating composition according to any one of items [2] to [5], wherein a mass ratio ((b2)/(B)) of the component (b2) to the component (B) is 0.01/1 to 1/1.

[7]

The coating composition according to any one of items [2] to [6], wherein a mass ratio ((b2)/(A)) of the component (b2) to the component (A) is 0.01/1 to 1/1.

[8]

The coating composition according to any one of items [1] to [7], wherein the component (B) has a core/shell structure comprising a core layer and one or two or more shell layers covering the core layer.

[9]

The coating composition according to item [8], wherein a mass ratio ((b2)/(b1)) of the component (b2) to the component (b1) in the core layer is 0.01/1 to 1/1, and the mass ratio ((b2)/(b1)) of the component (b2) to the component (b1) in an outermost layer of the shell layers is 0.01/1 to 5/1.

[10]

The coating composition according to any one of items [2] to [9], wherein the component (B) is a polymer emulsion particle obtained by polymerizing the polymerization material solution in the presence of a seed particle forming the core layer, and the seed particle is obtained by polymerizing at least one component selected from the group consisting of the component (b1), the component (b2) and a component (b5): another vinyl monomer copolymerizable with the component (b2).

[11]

The coating composition according to any one of items [2] to [10], wherein the component (b2) is a vinyl monomer having a secondary amide group, a tertiary amide group or both of those.

[12]

The coating composition according to any one of items [1] to [11], wherein a mass ratio ((A)/(B)) of the component (A) to the component (B) is 110/100 to 480/100.

[13]

The coating composition according to any one of items [1] to [12], further comprising a component (C): at least one hydrolyzable silicon compound selected from the group consisting of compounds represented by the following formulas (1), (2) and (3):

$$R^1{}_n SiX_{4-n} \quad (1)$$

wherein $R^1$ represents a hydrogen atom, or an alkyl group, alkenyl group, alkynyl group or aryl group having 1 to 10 carbon atoms and optionally having a halogen group, a hydroxy group, a mercapto group, an amino group, a (meth) acryloyl group or an epoxy group; X represents a hydrolyzable group; and n is an integer of 0 to 3.

$$X_3Si-R^2{}_n-SiX_3 \quad (2)$$

wherein X represents a hydrolyzable group; $R^2$ represents an alkylene group or phenylene group having 1 to 6 carbon atoms; and n is 0 or 1.

$$R^3-(O-Si(OR^3)_2)_n-OR^3 \quad (3)$$

wherein $R^3$ represents an alkyl group having 1 to 6 carbon atoms; and n is an integer of 2 to 8.

[14]

The coating composition according to item [13], wherein a mass ratio ((C)/(A)) of the component (C) to the component (A) is 1/100 to 150/100.

[15]

The coating composition according to any one of items [1] to [14], wherein the component (B) has a number average particle size of 10 nm to 100 nm.

[16]

The coating composition according to any one of items [1] to [15], wherein the component (A) comprises, a component (A1): silica having a number average particle size of 1 nm to 400 nm, and a component (A2): an infrared absorbent having a number average particle size of 1 nm to 2000 nm;

a mass ratio ((A1+A2)/(B)) of a total content of the component (A1) and the component (A2) to a content of the component (B) is 60/100 to 1000/100; and a mass ratio ((A2)/(A1+B)) of the content of the component (A2) to a total content of the component (B) and the component (A1) is 0.05/100 to 40/100.

[17]

The coating composition according to any one of items [1] to [16], wherein the component (A) comprises a component (A1): silica having a number average particle size of 1 nm to 400 nm, and a component (A3): a photocatalyst having a number average particle size of 1 nm to 2000 nm;

a mass ratio ((A1+A3)/(B)) of a total content of the component (A1) and the component (A3) to a content of the component (B) is 60/100 to 480/100; and a mass ratio ((A1)/(A1+A3)) of a content of the component (A1) to the total content of the component (A1) and the component (A3) is 85/100 to 99/100.

[18]

The coating composition according to any one of items [1] to [17] for antireflection.

[19]

The coating composition according to any one of items [1] to [17] for solvent resistance.

[20]

The coating composition according to any one of items [1] to [17] for antistatic use.

[21]

The coating composition according to any one of items [1] to [17] for heat resistance.

[22]

The coating composition according to any one of items [1] to [17] for hard coating.

[23]

A coating film obtained from the coating composition according to any one of items [1] to [22].

[24]

A coating film comprising (A) a metal oxide particle having a number average particle size of 1 nm to 400 nm, and (B) a polymer particle surrounded by the component (A), wherein a film formed of a component (B2) having a molecular cutoff of 50,000 or less and extracted from the component (B) by ultrafiltration has a surface water contact angle of 30° or less.

[25]

A coating film comprising (A) a metal oxide particle having a number average particle size of 1 nm to 400 nm, and (B) a polymer particle surrounded by the component (A), wherein a film formed of a component (B2) having a molecular cutoff of 50,000 or less and extracted from the component (B) by ultrafiltration has a surface water contact angle of more than 30° and the content thereof is 5 mass % or less.

[26]
The coating film according to item [24] or [25], wherein the component (B) is an emulsion particle.

[27]
The coating film according to any one of items [23] to [26], having a surface water contact angle at 20° C. of 30° or less.

[28]
The coating film according to any one of items [23] to [27], wherein the coating film after a high-temperature/high-humidity test in which the coating film is allowed to stand still for 24 hours under the conditions of a temperature of 90° C. and a humidity of 90% has a surface water contact angle of 20° or less.

[29]
A laminate having
a substrate and
a coating film obtained by applying the coating composition according to any one of items [1] to [22] or the coating film according to any one of items [23] to [28] and formed on at least one of surfaces of the substrate.

[30]
The laminate according to item [29], having a light transmittance higher than a light transmittance of the substrate.

[31]
The laminate according to item [29] or [30], wherein the coating film has a refractive index 0.1 or more lower than a refractive index of the substrate.

[32]
The laminate according to any one of items [29] to [31], wherein the coating film has two or more layers.

[33]
The laminate according to any one of items [29] to [32], wherein an outermost layer positioned on an opposite side of the substrate has a refractive index 0.1 or more lower than a refractive index of a layer adjacent to the outermost layer.

[34]
The laminate according to item [32] or [33], wherein layers constituting the coating film each have a thickness (dn) of 10 nm to 800 nm and a total thickness ($\Sigma$dn) of the coating film is 100 nm to 4000 nm.

[35]
The laminate according to any one of items [29] to [34], wherein the substrate has a light transmittance of 30% to 99%.

[36]
The laminate according to any one of items [29] to [35], wherein a ratio ((Rc)/(Rb)) of a reflectivity (Rc) of an opposite surface to the substrate of the coating film to a reflectivity (Rb) of the surface of the substrate on a coating film side is 98% or more.

[37]
The laminate according to any one of items [29] to [36], wherein the difference in refractive index between the coating film and the substrate is 0.2 or less.

[38]
The laminate according to any one of items [29] to [37], wherein the coating film has a refractive index of 1.30 to 1.48.

[39]
The laminate according to any one of items [36] to [38], wherein the surface of the substrate on the coating film side has the reflectivity (Rb) of 80% or more.

[40]
The laminate according to any one of items [29] to [39], wherein the substrate comprises at least one substance selected from the group consisting of glass, an acrylic resin, a polycarbonate resin, a cyclic olefin resin, a polyethylene terephthalate resin and an ethylene-fluoroethylene copolymer.

[41]
A method for manufacturing a laminate, comprising the steps of:
forming a coating film by applying the coating composition according to any one of items [1] to [22] on at least one of surfaces of a substrate, and
applying at least one of a thermal treatment at 70° C. or more and a pressurization treatment at 0.1 kPa or more to the coating film.

[42]
The laminate according to any one of items [29] to [40], which is a member for use in an energy conversion apparatus.

[43]
The laminate according to item [42], which is a protective member for a solar cell module.

[43]
A solar cell module comprising
the laminate according to item [42],
a backsheet arranged so as to face the laminate, and
an electric power generating element arranged between the laminate and the backsheet.

[45]
The laminate according to item [42], which is a protective member for a light reflecting mirror.

[46]
A reflector device having
a light reflecting mirror,
the laminate according to item [45] for protecting a reflection surface of the light reflecting mirror, and
a support for supporting the reflecting mirror.

[47]
A solar thermal power generation system comprising
the reflector device according to item [46], and
an apparatus for converting sunlight collected by the reflector device into electric energy.

Advantageous Effects of Invention

According to the present invention, it is possible to provide a coating composition for forming a coating film excellent in antifouling properties, transparency and hydrophilicity and capable of maintaining surface hydrophilicity even at high temperature.

DESCRIPTION OF EMBODIMENTS

Figure 1:
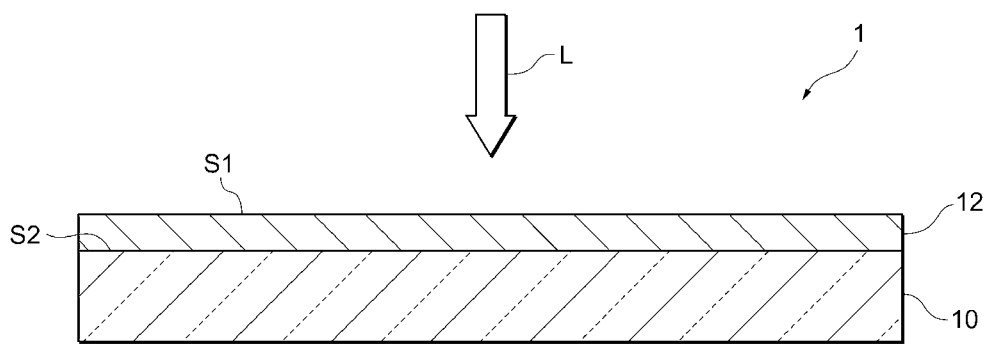
FIG. 1 is a schematic sectional view of a laminate according to an embodiment of the present invention.

Embodiments for carrying out the present invention (hereinafter, simply referred to as the "embodiment(s)") will be more specifically described. The embodiments below are merely illustration for explaining the present invention. The present invention would not be limited to the content below. The present invention can be carried out by appropriately modifying it within the gist thereof.

In the specification, "(meth)acryl" refers to "acryl" and the corresponding "methacryl"; "(meth)acrylate" refers to "acrylate" and the corresponding "methacrylate"; and "(meth)acryloyl" refers to "acryloyl" and the corresponding "methacryloyl".

<Coating Composition>

The coating composition of the embodiment contains (A) a metal oxide particle having a number average particle size of 1 nm to 400 nm, and (B) a polymer particle, in which the content of an aqueous-phase component in the component (B), represented by the following expression (I), is 20 mass % or less.

The content of the aqueous-phase component (%)= (dry mass of a filtrate obtained by filtering the component (B) at a molecular cutoff of 50,000)×(100−total mass of solid content)/(mass of the filtrate−dry mass of the filtrate)×100/the total mass of solid content       (I).

The present inventors found out that the contact angle of the surface of a coating film obtained increases mainly because an aqueous-phase component (hydrophobic component) flows out from the coating film. Based on the finding, they found that the hydrophilicity of the coating-film surface can be maintained by defining the content of the aqueous-phase component in the component (B) so as to fall within the above range, thereby defining a distribution coefficient in an aqueous medium. Note that the "coating film" described in the embodiment is not necessary to be a continuous film and may be a form such as a discontinuous film, a dispersed film like islands and the like.

Furthermore, it is preferable that the surface contact angle of the film formed from an aqueous-phase component at 20° C. is 30° or less. If the surface-water contact angle of the film formed from an aqueous-phase component at 20° C. is larger than 30°, the content thereof is preferably 5 mass % or less. The surface contact angle herein, which refers to the angle between a dry film and a tangent line of a water drop present on its surface, can be measured by a drop method. Note that "hydrophilicity" used in the embodiment means that the contact angle of water (23° C.) with respect to the surface of the object to be measured is preferably 60° or less, more preferably 30° or less and further preferably 20° or less.

Next, components that can be blended with a coating composition and a coating film will be described below.

The coating composition of the embodiment contains the component (A): a metal oxide particle having a number average particle size of 1 nm to 400 nm. By the presence of the component, the coating film having high transparency and hydrophilicity can be obtained. The component (A) is thought to interact with the component (B) and act as a curing agent for the component (B) (however, the function is not limited to this). Examples of the interaction may include, but not particularly limited to, a hydrogen bonding between a functional group (e.g., a hydroxy group and the like) that the component (A) generally has and a functional group (e.g., a hydroxy group, a carboxyl group, an amide group, an amino group, an ether group and the like) that the component (B) has, a chemical bonding (e.g., condensation) between the functional group that the component (A) generally has and the component (B) and the like.

The particle size of the component (A), which refers to a number average particle size (that may be a mixture of a primary particle and a secondary particle or either one of a primary particle and a secondary particle), is 1 nm to 400 nm, preferably 1 nm to 100 nm, more preferably 3 nm to 80 nm and further preferably 5 nm to 50 nm. The number average particle size of the component (A) within the aforementioned range can contribute to the optical characteristics and the like of the resultant coating film, laminate and the like. Particularly, by adjusting the number average particle size to 100 nm or less, the light transmittance of the resultant coating film and laminate can be greatly improved. Note that the number average particle size of the embodiment (hereinafter, sometimes simply referred to as the "particle size") is measured in accordance with the method described in Examples (described later).

The metal oxide to be used in the component (A) is not particularly limited, and a known metal oxide can be used. In view of the interaction with the component (B), at least one oxide selected from the group consisting of silicon dioxide, aluminum oxide, antimony oxide, titanium oxide, indium oxide, tin oxide, zirconium oxide, lead oxide, iron oxide, calcium silicate, magnesium oxide, niobium oxide and cerium oxide is preferable. Of these, since a large number of surface hydroxy groups are present and interaction with the component (B) is particularly strong, at least one oxide selected from the group consisting of a silicon dioxide (silica), aluminum oxide (alumina), antimony oxide and complex oxide of these is more preferable. Since, in forming a coating film as described later, a continuous phase can be formed of the component (A) having a large number of surface hydroxy groups, with the result that the density of the hydroxy groups in the coating-film surface increases and hydrophilicity thereof increases, the aforementioned metal oxides are more preferable. The metal oxides of the component (A) may be used singly or in combinations of two or more.

Examples of the form of the component (A) include, but not particularly limited to, powder, fluid dispersion, sol and the like. The "fluid dispersion" and "sol" refer to the state where the component (A) is dispersed in water, a hydrophilic organic solvent or a solvent mixture of these in the form of at least one of a primary particle and a secondary particle with a concentration of 0.01 to 80 mass % and preferably 0.1 to 50 mass %.

Examples of the hydrophilic organic solvent include alcohols such as ethylene glycol, butyl cellosolve, n-propanol, isopropanol, n-butanol, ethanol, methanol and the like; ketones such as acetone, methyl ethyl ketone, methyl isobutyl ketone and the like; ethers such as tetrahydrofuran, dioxane and the like; amides such as dimethylacetamide, dimethylformamide and the like; dimethyl sulfoxide; nitrobenzene; and a mixture of two or more thereof.

Depending upon the properties to be added to a coating composition or a coating film, a preferable component can be appropriately selected as the component (A) from the aforementioned components and other components. Examples of the properties to be added to a coating composition or a coating film include antireflection properties, solvent resistance, antistatic properties, heat resistance, hard coating properties, photocatalyst activity and the like. Depending upon desired properties, the component to be added, the content and number average particle size can be appropriately selected. Furthermore, in the cases where an effect of a specific performance is desirably enhanced, and where a plurality of performances are desirably added to the coating composition, at least two types of metal oxides can be used in combination. Based on this viewpoint, typical compounds include (A1) silica, (A2) an infrared absorbent, (A3) a photocatalyst, (A4) a conductive metal oxide and the like. Now, these compounds will be described below.

The component (A1) is not particularly limited as long as it is silica (so called "silicon dioxide"). A production process thereof is not particularly limited. For example, production may be made by a precipitation method, a dry method and the like. In view of handling, colloidal silica is more preferable. In the case where the component (A1) is colloidal silica, a sol-gel process can be used for preparation and a commercially available product can be used. In the case where colloidal silica is prepared by a sol-gel process, reference can be made to Werner Stober et al; J. Colloid and Interface Sci., 26, 62-69 (1968), Rickey D. Badley et al; Lang muir 6, 792-801 (1990); Journal of the Japan Society of Colour Material, 61 [9] 488-493 (1988) and the like to prepare it.

Colloidal silica is a dispersion of silica, which contains silicon dioxide as a fundamental unit, in water or a water soluble solvent. The number average particle size thereof is preferably 1 nm to 400 nm, more preferably 1 nm to 200 nm, further preferably 1 nm to 100 nm, and further more preferably 5 nm to 30 nm. By adjusting the number average particle size to 1 nm or more, the storage stability of the coating film and the coating composition (described later) becomes more excellent. By adjusting the number average particle size to 100 nm or less, the transparency of the coating film is more improved. Colloidal silica having a particle size within the aforementioned range can be used in the state of an aqueous fluid dispersion regardless of whether it is acidic or basic. The pH thereof can be appropriately selected depending upon the stable region of the aqueous dispersion of the component (B) mixed in combination.

Examples of the acidic colloidal silica using water as a dispersion medium include commercially available products such as SNOWTEX (trade mark)-O, SNOWTEX-OS and SNOWTEX-OL manufactured by Nissan Chemical Industries, Ltd.; Adelite (trade mark) AT-20Q manufactured by ADEKA CORPORATION; and Crebosol (trade mark) 20H12 and Crebosol 30CAL25, manufactured by Clariant (Japan) K.K.

Examples of the basic colloidal silica include silica stabilized with the addition of an alkaline metal ion, an ammonium ion, an amine or the like. More specifically, examples thereof include commercially available products such as SNOWTEX-20, SNOWTEX-30, SNOWTEX-C, SNOWTEX-C30, SNOWTEX-CM40, SNOWTEX-N, SNOWTEX-N30, SNOWTEX-K, SNOWTEX-XL, SNOWTEX-YL, SNOWTEX-ZL, SNOWTEX PS-M and SNOWTEX PS-L manufactured by Nissan Chemical Industries, Ltd.; Adelite AT-20, Adelite AT-30, Adelite AT-20N, Adelite AT-30N, Adelite AT-20A, Adelite AT-30A, Adelite AT-40 and Adelite AT-50 manufactured by ADEKA CORPORATION; Crebosol 30R9, Crebosol 30R50 and Crebosol 50R50 manufactured by Clariant (Japan) K.K.; and Ledoux (trade mark) HS-40, Ledoux HS-30, Ledoux LS and Ledoux SM-30 manufactured by Du Pont Kabushiki Kaisha.

Examples of the colloidal silica using a water soluble solvent as a dispersion medium include commercially available products such as MA-ST-M (a number average particle size of 20 nm to 25 nm, dispersed in methanol), IPA-ST (a number average particle size of 10 nm to 15 nm, dispersed in isopropyl alcohol), EG-ST (a number average particle size of 10 nm to 15 nm, dispersed in ethylene glycol), EG-ST-ZL (a number average particle size of 70 nm to 100 nm, dispersed in ethylene glycol), NPC-ST (a number average particle size of 10 nm to 15 nm, dispersed in ethylene glycol monopropyl ether) manufactured by Nissan Chemical Industries, Ltd.

The colloidal silica may be used singly or in combinations of two or more. If the metal oxide serving as the component (A) contains colloidal silica as a major component, alumina, sodium aluminate and the like may be contained as a minor component. Furthermore, the colloidal silica may exist together with a stabilizer such as an inorganic base (sodium hydroxide, potassium hydroxide, lithium hydroxide, ammonia and the like) and an organic base (tetramethylammonium and the like). The main component herein refers to a component contained in an amount of 50 mass % or more and preferably 70 mass % or more in the metal oxide.

The infrared absorbent serving as the component (A2), which has an absorption band in the infrared region (wavelength 800 nm or more) is an organic substance, an inorganic substance and a mixture thereof. Examples of the infrared absorbent include inorganic microparticles and organic microparticles. Specific examples of the inorganic microparticles include microparticles of cerium oxide or zinc oxide optionally coated with silica; transparent conductive microparticles such as indium oxide doped with tin (ITO), tin oxide doped with antimony (ATO) and tin oxide doped with fluorine (FTO); microparticles of a noble metal such as silver, gold, platinum, rhodium and palladium, and composite tungsten-oxides represented by the formula MxWyOz (where, M represents at least one element selected from the group consisting of H, He, an alkali metal, an alkaline-earth metal, a rare-earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I; W represents tungsten; and O represents oxygen, $0.0001 \leq x/y \leq 1.5$, $1.0 \leq z/y \leq 5.0$). Besides these, microparticles having absorption within the ultraviolet region, such as zirconium oxide, tin oxide, bismuth oxide and titanium oxide may be used singly or in combinations of two or more.

These infrared absorbents are relatively stable and can be microparticulated and thus are preferable since they can absorb light in the infrared wavelength region while suppressing scattering in a visible light region. Of these, at least one selected from the group consisting of the infrared absorbent coated with ITO, ATO, cerium oxide, zinc oxide or silica is more preferable.

The organic microparticle is not particularly limited in type and composition as long as it is a pigment having a maximum absorption wavelength within a near-infrared light (800 nm to 1100 nm) wavelength region and the like. For example, a diimonium-based near-infrared light absorption pigment is preferable. The diimonium-based near-infrared light absorption pigment has a strong absorbance of about 100,000 of molar absorption coefficient in the near-infrared light region of a wavelength of 850 nm to 1100 nm and a weak absorbance in the visible light region of 400 nm to 500 nm in wavelength. Therefore, the transmitted light is yellow-brown. However, since visible-light transmittance of the pigment is superior to other near-infrared light absorbing pigments, the diimonium-based near-infrared light absorption pigment is preferable in order to obtain a high transmittance within the visible light range. One or more pigments selected from the group consisting of a phthalocyanine pigment, an organic metal complex pigment and a cyanine pigment, which have a maximum absorption in a wavelength of 750 nm to 950 nm and no absorption within a visible light range, may be used singly or in combinations of two or more. Furthermore, a conductive polymer represented by polyaniline, polypyrrol, polythiophene, polyvinyl sulfonic acid and the like can be used.

In order to provide a coating film with thermal insulating properties, coloring pigments can be used as the component (A2) singly or in combination. In this case, the coloring pigment preferably has a solar reflectance, for example defined in JIS A5759-1998, of 13% or more. Specific examples thereof include white pigments such as titanium white and a zinc oxide pigment; red pigments such as an iron oxide pigment and a quinacridon pigment; yellow pigments such as an iron oxide pigment, an iron hydroxide pigment, a lead chromate pigment and an azo pigment; blue pigments such as phthalocyanine blue and a complex oxide pigment; and green pigments such as chromium green and phthalocyanine green pigment.

An infrared absorbent ideally has no absorption in the infrared wavelength region of sunlight, particularly, a wavelength region corresponding to a silicon absorption band, and preferably has an average reflectivity of 25% or less within a visible ultraviolet light region of 300 nm to 780 nm in wavelength and an average reflectivity of 15% or more within an infrared light region of 780 nm to 2500 nm in wavelength.

In the case where the component (A2) is contained, an absorbance of 0.1% or more is preferably obtained in the wavelength region of 1000 nm to 2500 nm. In the wavelength region of 1000 nm to 2500 nm, where infrared light can be efficiently converted into heat, the absorbance is preferably 0.1% or more, and more preferably 10% or more. However, since the wavelength region overlaps with a silicon absorption region, the addition amount can be controlled depending upon the absorption capacity of an infrared absorbent.

The particle size is controlled so as not to scatter light within the silicon absorption wavelength range by scattering of particles. In this manner, an increase of temperature can be effectively suppressed without affecting the performance of solar cell power generation. In view of this, the number average particle size is preferably 10 nm to 2000 nm, more preferably 10 nm to 1500 nm and further preferably 10 nm to 1000 nm. The number average particle size of 10 nm or more enables dispersion stability to be maintained. The number average particle size of 2000 nm or less suppresses increase of the intensity of scattered light and reduction of the power generation efficiency of a solar cell, even if the addition amount of component (A2) is large.

Generally, since these infrared absorbents tend to be less dispersed in an aqueous solvent, an infrared absorbent (A2) whose surface is uniformly or nonuniformly coated with silica used as the component (A1) is preferable. This enables the blending stability with the component (A1), the weather-resistance of the infrared absorbent (A2) and the like to be further improved. A method for coating the infrared absorbent (A2) with silica (A1) is not particularly limited and a known method is employed. For example, the infrared absorbent is dispersed in water and subjected to a dispersion treatment performed by a high-pressure homogenizer, and thereafter tetraethoxy silane, water glass and the like are added thereto with stirring and while appropriately controlling pH simultaneously controlling temperature to obtain an infrared absorbent coated with silica.

Examples of the form of the component (A2) include, but not particularly limited to, powder, fluid dispersion, sol and the like. The "fluid dispersion" and "sol" herein refer to a state where the component (A2) is dispersed in water and/or a hydrophilic organic solvent in a concentration of 0.01 to 80 mass % and preferably 0.1 to 50 mass % in the form of a primary particle and/or secondary particle.

The number average particle size of the component (A2) observed in the fluid dispersion or sol can contribute to optical characteristics of the resultant coating film and the like. Particularly, if the number average particle size is 100 nm or less, the transparency of the resultant coating film can be significantly improved.

The photocatalyst serving as the component (A3) refers to a compound (hereinafter, sometimes simply referred to as the "photocatalyst") exhibiting at least one of photocatalyst activity and hydrophilicity by light irradiation. If a compound exhibits photocatalyst activity by light irradiation, the surface of the resultant coating film is excellent in activity (organic substance degradability) of decomposing a contaminant organic substance and resistance to fouling.

Examples of the photocatalyst include $TiO_2$, ZnO, $SrTiO_3$, $BaTiO_3$, $BaTiO_4$, $BaTi_4O_9$, $K_2NbO_3$, $Nb_2O_5$, $Fe_2O_3$, $Ta_2O_5$, $K_3Ta_3Si_2O_3$, $WO_3$, $SnO_2$, $Bi_2O_3$, $BiVO_4$, NiO, $Cu_2O$, $RuO_2$, $CeO_2$, and further, a sheet oxide having at least one element selected from the group consisting of Ti, Nb, Ta and V (see, for example, Japanese Patent Application Laid-Open No. 62-74452, Japanese Patent Application Laid-Open No. 2-172535, Japanese Patent Application Laid-Open No. 7-24329, Japanese Patent Application Laid-Open No. 8-89799, Japanese Patent Application Laid-Open No. 8-89800, Japanese Patent Application Laid-Open No. 8-89804, Japanese Patent Application Laid-Open No. 8-198061, Japanese Patent Application Laid-Open No. 9-248465, Japanese Patent Application Laid-Open No. 10-99694 and Japanese Patent Application Laid-Open No. 10-244165). Of these photocatalysts, $TiO_2$ (titanium oxide) is preferable since it is nontoxic and excellent in chemical stability. The titanium oxide with an anatase structure, a rutile structure or a brookite structure can be used.

In view of exhibiting antistatic properties of the resultant coating composition and the like, a conductive metal oxide can be used as the component (A4). Examples of such a conductive metal oxide include indium oxide (ITO) doped with tin, tin oxide (ATO) doped with antimony, tin oxide, zinc oxide and the like. Furthermore, in view of the interaction with the component (B), for example, aluminum oxide, antimony oxide, indium oxide, tin oxide, zirconium oxide, lead oxide, iron oxide, calcium silicate, magnesium oxide, niobium oxide and cerium oxide, can be used in combination with the conductive metal oxide.

The component (B) is a polymer particle. In the coating film of the embodiment, it is preferable that (B) the polymer particle is surrounded by the component (A). (B) The polymer particle refers to a polymer particle obtained by polymerizing a monomer component having an unsaturated bond in the presence of a radical, a cation and/or an anion.

In the embodiment, the content of the aqueous-phase component of the component (B), represented by the expression (I) is 20 mass % or less. By adjusting the content of the aqueous-phase component of the component (B) to 20 mass % or less, transparency and hydrophilicity become excellent and excellent hydrophilicity can be maintained even at high temperature.

The content of the aqueous-phase component (%)= (dry mass of a filtrate obtained by filtering the component (B) at a molecular cutoff of 50,000)×(100−total mass of solid content)/(mass of the filtrate−dry mass of the filtrate)×100/the total mass of solid content     (I).

The content of the aqueous-phase component of the component (B) is preferably 15 mass % or less and more preferably 10 mass % or less, thereby having excellent antifouling properties, transparency and hydrophilicity, and maintaining excellent hydrophilicity not only at high temperature but also at high humidity as well as even at high temperature/humidity.

The component (B) is preferably an emulsion particle. By virtue of the emulsion particle, a sea-island structure can be formed by the component (A) and the component (B) when a coating film (described later) is formed. By forming the sea-island structure, a metal oxide is localized in the uppermost surface of the coating film and thus hydrophilicity can be satisfactorily exhibited by a hydrophilic group such as a hydroxy group of the metal oxide. Examples of the emulsion particle include, but not particularly limited to, an acryl emulsion, a styrene emulsion, an acrylstyrene emulsion, an acryl silicon emulsion, a silicon emulsion and a fluorine resin emulsion.

The component (B) is more preferably a polymer emulsion particle obtained, in a polymerization material solution containing a component (b1): a hydrolyzable silicon compound, a component (b2): a vinyl monomer, a component (b3): an emulsifier and a component (b4): water, by polymerizing the component (b1) and the component (b2). The component (B) thus obtained and that can be preferably used is a compound obtained by conjugating a hydroxy group derived from the component (b1) and a polymerization product serving as the component (b2) via a hydrogen bond and the like.

Examples of the component (b1) include a compound represented by the following formula (4) and a condensate thereof, and a silane coupling agent.

$$SiW_xR_y \qquad (4)$$

where W represents at least one group selected from the group consisting of an alkoxy group having 1 to 20 carbon atoms, a hydroxy group, an acetoxy group having 1 to 20 carbon atoms, a halogen atom, a hydrogen atom, an oxime group having 1 to 20 carbon atoms, an enoxy group, an aminoxy group and an amide group; R represents at least one hydrocarbon group selected from the group consisting of a linear or branched alkyl group having 1 to 30 carbon atoms, a cycloalkyl group having 5 to 20 carbon atoms and an aryl group having 6 to 20 carbon atoms unsubstituted or substituted with an alkyl group having 1 to 20 carbon atoms, an alkoxy group having 1 to 20 carbon atoms or a halogen atom; x is an integer of 1 or more and 4 or less, y is an integer of 0 or more and 3 or less; and x+y=4.

The silane coupling agent refers to a silane derivative having intramolecular functional group which is reactive with an organic substance such as a vinyl polymerizable group, an epoxy group, an amino group, a methacryl group, a mercapto group and an isocyanate group.

Specific examples of the compound represented by the formula (4) include tetraalkoxysilanes such as tetramethoxysilane, tetraethoxysilane, tetra-n-propoxysilane, tetraisopropoxysilane and tetra-n-butoxysilane; trialkoxysilanes such as methyltrimethoxysilane, methyltriethoxysilane, ethyltrimethoxysilane, ethyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, allyltrimethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl) ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-(meth)acryloyloxypropyltri-n-propoxysilane, 3-(meth)acryloyloxypropyltriisopropoxysilane, 3-ureidopropyltrimethoxysilane and 3-ureidopropyltriethoxysilane; dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, diisopropyldimethoxysilane, diisopropyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane and 3-(meth)acryloyloxypropylmethyldimethoxysilane; and monoalkoxysilanes such as trimethylmethoxysilane and trimethylethoxysilane. These may be used singly or in combinations of two or more.

As the component (b1), a silicon alkoxide having a phenyl group (for example, phenyltrimethoxysilane, phenyltriethoxysilane and diphenyldimethoxysilane) can be used. A silicon alkoxide having a phenyl group is preferably used because polymerization stability in the presence of water and an emulsifier becomes excellent.

The component (b1) may include a silane coupling agent having a thiol group and a component (b1-1): a hydrolyzable silicon compound having a vinyl polymerizable group. These are preferably used as the component (b1) because the long-term antifouling properties of the resultant coating film become excellent.

Examples of the silane coupling agent having a thiol group include 3-mercaptopropyltrimethoxysilane and 3-mercaptopropyltriethoxysilane.

Examples of the component (b1-1) include a silane coupling agent having a vinyl polymerizable group such as 3-(meth)acryloxypropyltrimethoxysilane, 3-(meth)acryloxypropyltriethoxysilane, 3-(meth)acryloyloxypropylmethyldimethoxysilane, 3-(meth)acryloyloxypropyltri-n-propoxysilane, 3-(meth)acryloyloxypropyltriisopropoxysilane, vinyltrimethoxysilane, vinyltriethoxysilane, allyltrimethoxysilane and 2-trimethoxysilylethyl vinyl ether.

These silane coupling agents can produce a chemical bond via copolymerization or chain transfer reaction with component (b2) (described later). Therefore, if a silane coupling agent having a vinyl polymerizable group or a thiol group is mixed or conjugated with the aforementioned component (b1), a polymerization product of the component (b1) and a polymerization product of the component (b2) (described later) can be conjugated by a chemical bond.

In the component (b1-1), examples of the "vinyl polymerizable group" include a vinyl group and an allyl group. Of these, 3-(meth)acryloxypropyl group is preferable.

The component (b1) may include a component (b1-2): a cyclic siloxane oligomer. Use of the component (b1-2) is preferable because the flexibility of the resultant coating film is more improved.

Examples of the cyclic siloxane oligomer may include compounds represented by the following formula (5).

$$(R'_2SiO)_m \qquad (5)$$

where R' is at least one selected from the group consisting of a hydrogen atom, a linear or branched alkyl group having 1 to 30 carbon atoms, a cycloalkyl group having 5 to 20 carbon atoms and an aryl group having 6 to 20 carbon atoms unsubstituted or substituted with an alkyl group having 1 to 20 carbon atoms, an alkoxy group having 1 to 20 carbon atoms or a halogen atom; m is an integer; and $2 \leq m \leq 20$.

Of them, in view of reactivity and the like, a cyclic dimethylsiloxane oligomer such as octamethylcyclotetrasiloxane is preferable.

If a condensate is used as the component (b1), the polystyrene-equivalent weight average molecular weight (by the GPC method) of the condensate is preferably 200 to 5000 and more preferably 300 to 1000.

The mass ratio ((b1)/(B)) of the content of the component (b1) to the content of the component (B) is preferably 0.01/100 to 80/100 and more preferably 0.1/100 to 70/100 in view of polymerization stability.

The mass ratio ((b1-1)/(B)) of the content of the component (b1-1) to the content of the component (B) is preferably 0.01/100 to 20/100 and more preferably 0.5/100 to 10/100 in view of polymerization stability. The mass ratio ((b1-1)/(b2)) of the content of the component (b1-1) to the content of the component (b2) is preferably 0.1/100 to 100/100 and more preferably 0.5/100 to 50/100 in view of polymerization stability.

The mass ratio ((b1-2)/(B)) of the content of the component (b1-2) to the content of the component (B) is preferably 0.01/100 to 20/100 and more preferably 0.5/100 to 5/100 in view of hydrophilicity. The mass ratio ((b1-2)/(b2)) of the content of the component (b1-2) to the content of the component (b2) is preferably 0.5/100 to 50/100 and more preferably 1.0/100 to 20/100 in view of polymerization stability.

The component (b2) is a vinyl monomer. The component (b2) is preferably a vinyl monomer having at least one functional group selected from the group consisting of a hydroxy group, a carboxyl group, an amide group, an amino group and an ether group. If the vinyl monomer has such a functional group, chemical bonding (for example, condensation) to a functional group of a component other than the component (B) (for example, a metal oxide of the component (A)) can be easily made, enhancing interaction.

Specific examples of the hydroxy group-containing vinyl monomer serving as the component (b2) include a hydroxyalkyl(meth)acrylate such as 2-hydroxyethyl(meth)acrylate, 2-hydroxypropyl(meth)acrylate or 4-hydroxybutyl(meth) acrylate; a hydroxy group-containing vinyl ether such as 2-hydroxyethylvinyl ether or 4-hydroxybutylvinyl ether; a hydroxy group-containing allyl ether such as 2-hydroxyethyl allyl ether; a monoester of a polyoxyalkylene glycol obtained from a polyether polyol represented by polyethylene glycol and an unsaturated carboxylic acid represented by (meth)acrylic acid; an adduct of any one of the hydroxy group-containing monomers mentioned above and a lactone represented by ε-caprolactone; an adduct of an epoxy group-containing unsaturated monomer represented by glycidyl (meth)acrylate and an acid represented by acetic acid; and an adduct of an unsaturated carboxylic acid represented by (meth)acryl acid and a monoepoxy compound except for α-olefin epoxide represented by "Cardura-E" (trade name, manufactured by Shell in Netherland).

Specific examples of the carboxyl group-containing vinyl monomer mentioned as the component (b2) include an unsaturated carboxylic acid such as (meth)acrylic acid, 2-carboxyethyl(meth)acrylate, crotonic acid, itaconic acid, maleic acid or fumaric acid; a monoester (half ester) of an unsaturated dicarboxylic acid and a saturated monoalcohol such as monomethyl itaconate, mono-n-butyl itaconate, monomethyl maleate, mono-n-butyl maleate, monomethyl fumalate, mono-n-butyl fumalate; a monovinyl ester of a saturated dicarboxylic acid such as monovinyl adipate or monovinyl succinate; a product of an addition reaction between a saturated polycarboxylic acid anhydride such as a succinic anhydride, a glutaric anhydride, a phthalic anhydrite or trimellitic anhydride, and any one of the hydroxy group-containing vinyl monomers mentioned above; and a monomer obtained by an addition reaction of any one of the carboxyl group-containing monomer mentioned above and a lactone.

Specific examples of the amino group-containing vinyl monomer mentioned as the component (b2) include a tertiary amino group-containing (meth)acrylate such as 2-dimethylaminoethyl(meth)acrylate, 2-diethylaminoethyl (meth)acrylate, 2-di-n-propylaminoethyl(meth)acrylate, 3-dimethylaminopropyl(meth)acrylate, 4-dimethylaminobutyl(meth)acrylate or N-[2-(meth)acryloyloxy]ethyl morpholine; a tertiary amino group-containing aromatic vinyl monomer such as vinylpyridine, N-vinylcarbazole or N-vinylquinoline; a tertiary amino group-containing (meth)acrylamide such as N-(2-dimethylamino)ethyl(meth)acrylamide, N-(2-diethylamino)ethyl(meth)acrylamide, N-(2-di-n-propylamino)ethyl(meth)acrylamide, N-(3-dimethylamino)propyl(meth)acrylamide, N-(4-dimethylamino)butyl(meth) acrylamide or N-[2-(meth)acrylamide]ethylmorpholine; a tertiary amino group-containing crotonic acid amide such as N-(2-dimethylamino)ethylcrotonic acid amide, N-(2-diethylamino)ethylcrotonic acid amide, N-(2-di-n-propylamino) ethylcrotonic acid amide, N-(3-dimethylamino)propylcrotonic acid amide or N-(4-dimethylamino)butylcrotonic acid amide; and a tertiary amino group-containing vinyl ether such as 2-dimethylaminoethyl vinyl ether, 2-diethylaminoethyl vinyl ether, 3-dimethylaminopropyl vinyl ether or 4-dimethylaminobutyl vinyl ether.

Specific examples of the ether group-containing vinyl monomer mentioned as the component (b2) include vinyl monomers such as a vinyl ether having a polyether chain in a side chain such as polyoxyethylenealkyl ether, polyoxyethylenealkylphenyl ether, a higher fatty acid ester of a polyoxyethylene or a polyoxyethylene-polyoxypropylene block copolymer; an allyl ether and a (meth)acrylate. As the ether group-containing vinyl monomer, a commercially available product can be used. Examples thereof include BLEMMER PE-90, PE-200, PE-350, PME-100, PME-200, PME-400 and AE-350 (trade name, manufactured by NOF Corporation); and MA-30, MA-50, MA-100, MA-150, RA-1120, RA-2614, RMA-564, RMA-568, RMA-1114 and MPG130-MA (trade name, manufactured by Nippon Nyukazai Co., Ltd.). The number of oxyethylene units of the polyoxyethylene chain herein is preferably 2 to 30. If the number is less than 2, the flexibility of the resultant coating film tends to be insufficient. If the number exceeds 30, the resultant coating film becomes flexible and thus tends to be inferior in blocking resistance.

Specific examples of the amide group-containing vinyl monomer mentioned as the component (b2) include N-alkylor N-alkylene-substituted (meth)acrylamide. More specific examples thereof include N-methylacrylamide, N-methylmethacrylamide, N-ethylacrylamide, N,N-dimethylacrylamide, N,N-dimethylmethacrylamide, N,N-diethylacrylamide, N-ethylmethacrylamide, N-methyl-N-ethylacrylamide, N-methyl-N-ethylmethacrylamide, N-isopropylacrylamide, N-n-propylacrylamide, N-isopropylmethacrylamide, N-n-propylmethacrylamide, N-methyl-N-n-propylacrylamide, N-methyl-N-isopropylacrylamide, N-acryloylpyrrolidine, N-methacryloylpyrrolidine, N-acryloylpiperidine, N-methacryloylpiperidine, N-acryloylhexahydroazepine, N-acryloylmorpholine, N-methacryloylmorpholine, N-vinylpyrrolidone, N-vinylcaprolactam, N,N'-methylenebisacrylamide, N,N'-methylene bismethacrylamide, N-vinylacetamide, diacetoneacrylamide, diacetonemethacrylamide, N-methylolacrylamide and N-methylolmethacrylamide.

As the component (b2), in view of improving hydrogen bonding to other components, a vinyl monomer containing a secondary amide group, a tertiary amide group or both of them is preferable. Particularly, a vinyl monomer having a tertiary amide group is preferable in view of hydrogen bonding power.

The mass ratio ((b2)/(B)) of the content of the component (b2) to the content of the component (B) is 0.01/1 to 1/1 in view of polymerization stability, preferably 0.1/1 to 0.5/1 and more preferably 0.2/1 to 0.4/1.

The mass ratio ((b2)/(A1)) of the content of the component (b2) to the content of the component (A1) is 0.01/1 to 1/1 in view of hydrogen bonding and blending stability, preferably 0.1/1 to 1/1 and more preferably 0.2/1 to 0.7/1.

Examples of the component (b3) include an acidic emulsifier such as alkylbenzene sulfonic acid, alkyl sulfonic acid, alkylsulfosuccinic acid, polyoxyethylenealkyl sulfuric acid, polyoxyethylene alkylarylsulfuric acid and polyoxyethylene distyrylphenylether sulfonic acid; an anionic surfactant such as an alkaline metal (e.g., Li, Na, K) salt of an acidic emulsifier, an ammonium salt of an acidic emulsifier and fatty acid soap; cationic surfactant of a quaternary ammonium salt, a pyridinium salt and an imidazolinium salt such as alkyltrimethylammonium bromide, alkylpyridinium bromide and imidazolinium laurate; a nonionic surfactant such as polyoxyethylene alkylaryl ether, a polyoxyethylene sorbitan fatty acid ester, a polyoxyethylene oxypropylene block copolymer and polyoxyethylene distyryl phenyl ether, and the like. These may be used singly or in combinations of two or more.

As the component (b3), in view of improving water dispersion stability of the resultant component (B) and improving long-term antifouling properties of the resultant coating film, a reactive emulsifier having a radical polymerizable double bond is preferably used. Examples of the reactive emulsifier include a vinyl monomer having a sulfonic acid group or a sulfonate group, a vinyl monomer having a sulfuric acid ester group and an alkali metal salt and ammonium salt thereof; a vinyl monomer having a nonionic group such as polyoxyethylene and a vinyl monomer having a quaternary ammonium salt.

Examples of the vinyl monomer having a sulfonic acid group or a sulfonate group include a compound having a radical polymerizable double bond and having a substituent selected from the group consisting of an alkyl group having 1 to 20 carbon atoms, an alkyl ether group having 2 to 4 carbon atoms, a polyalkyl ether group having 2 to 4 carbon atoms, a phenyl group, a naphthyl group and a succinic acid group, which are partly substituted with a substituent such as an ammonium salt, sodium salt or potassium salt of a sulfonic acid group; and a vinyl sulfonate compound having a vinyl group to which a substituent such as an ammonium salt, a sodium salt or a potassium salt of a sulfonic acid group is bound.

Examples of the vinyl monomer having a sulfuric acid ester group include a compound having a radical polymerizable double bond and a substituent selected from the group consisting of an alkyl group having 1 to 20 carbon atoms, an alkyl ether group having 2 to 4 carbon atoms, a polyalkyl ether group having 2 to 4 carbon atoms, a phenyl group and a naphthyl group, which are partly substituted with a substituent such as an ammonium salt, sodium salt or potassium salt of a sulfonic acid ester group.

Specific examples of the compound having a succinic acid group partly substituted with a substituent such as an ammonium salt, sodium salt or potassium salt of a sulfonic acid group include an allyl sulfo succinate. More specific examples include ELEMINOL JS-2 (trade name, manufactured by Sanyo Chemical Industries, Ltd.) and Latemul S-120, S-180A or S-180 (trade name, manufactured by Kao Corp.).

Specific examples of the compound having an alkyl ether group having 2 to 4 carbon atoms or a polyalkyl ether group having 2 to 4 carbon atoms partly substituted with a substituent such as an ammonium salt, sodium salt or potassium salt of a sulfonic acid group include Aqualon HS-10 or KH-1025 (trade name, manufactured by Dai-ichi Kogyo Seiyaku Co., Ltd.) and ADEKA REASOAP SE-1025N or SR-1025 (trade name, manufactured by ADEKA CORPORATION).

Specific examples of the vinyl monomer having a nonion group include α-[1-[(allyloxy)methyl]-2-(nonylphenoxy) ethyl]-ω-hydroxypolyoxyethylene (trade name: e.g., ADEKA REASOAP NE-20, NE-30 and NE-40 manufactured by ADEKA CORPORATION) and polyoxyethylene alkylpropenyl phenyl ether (trade name: e.g., Aqualon RN-10, RN-20, RN-30 and RN-50, Dai-ichi Kogyo Seiyaku Co., Ltd.).

The use amount of component (b3) to 100 parts by mass of the component (B) is preferably 10 not more than parts by mass and more preferably 0.001 to 5 parts by mass, in view of polymerization stability.

The component (B) is a polymer emulsion particle, which is obtained, in a polymerization material solution containing the aforementioned components (b1) to (b3) and a component (b4) (i.e., water), by polymerizing the component (b1) and the component (b2). The use amount of component (b4), i.e., the content thereof in the polymerization material solution, is preferably 30 to 99.9 mass %, in view of polymerization stability.

To the polymerization material solution, in addition to the components (b1) to (b4), various components can be further added. First, to the polymerization material solution, it is preferable that the component (b5): another vinyl monomer copolymerizable with the component (b2), can be further added. Use of such a component (b5) is preferable to control properties of the polymerization product to be produced (glass transition temperature, molecular weight, hydrogen bonding ability, polar, dispersion stability, weather-resistance, compatibility with a polymerization product of hydrolyzable silicon compound serving as the component (b1) and the like).

Examples of the component (b5) include an acrylate, a methacrylate, an aromatic vinyl compound and a vinyl cyanide. Other than these, examples thereof include a functional group-containing monomer such as an epoxy group-containing vinyl monomer, a carbonyl group-containing vinyl monomer and an anionic vinyl monomer.

The ratio of the component (b5) in the total vinyl monomer preferably falls within the range of 0.001 to 30 mass % and more preferably 0.05 to 10 mass %. Use of the component (b5) within this range is preferable since glass transition temperature, molecular weight, hydrogen bonding ability, polarity, dispersion stability, weather-resistance, compatibility with a polymerization product of a hydrolyzable silicon compound serving as the component (b1) and the like can be controlled.

To the polymerization material solution, a chain transfer agent can be added. Examples of the chain transfer agent include an alkyl mercaptan such as n-octyl mercaptan, n-dodecyl mercaptan and t-dodecyl mercaptan; an aromatic mercaptan such as benzyl mercaptan and dodecyl benzyl mercaptan; and a thiocarboxylic acid such as thiomalic acid, a salt thereof or an alkyl ester thereof, or a polythiole, diisopropyl xanthogen disulfide, di(methylenetrimethylolpropane) xanthogen disulfide, thioglycol and an allyl compound such as a dimer of α-methylstyrene.

The use amount of chain transfer agents to the total vinyl monomer (100 parts by mass) is preferably 0.001 to 30 parts by mass and more preferably 0.05 to 10 parts by mass. Use of a chain transfer agent within the range is preferable in view of polymerization stability.

Furthermore, in the polymerization material solution, a dispersion stabilizer can be blended. Examples of the dispersion stabilizer include, but not particularly limited to, a water soluble oligomer selected from the group consisting of a polycarboxylic acid and a sulfonate and a synthetic or naturally occurring water soluble or water dispersible polymer substance such as polyvinyl alcohol, hydroxyethylcellulose, starch, maleinized polybutadiene, maleinized alkyd resin, polyacrylic acid (polyacrylate), polyacrylamide, and a water soluble or water dispersible acrylic resin. These may be used singly or in combinations of two or more.

The use amount of dispersion stabilizer to 100 parts by mass of the component (B), i.e., a polymer emulsion particle, is preferably not more than 10 parts by mass and more preferably 0.001 to 5 parts by mass.

Polymerization of the aforementioned polymerization material solution is preferably performed in the presence of a polymerization catalyst. Example of the polymerization catalyst serving as the component (b1) include an acidic compound such as a hydrogen halide such as hydrochloric acid and hydrofluoric acid, a carboxylic acid such as acetic acid, trichloroacetic acid, trifluoroacetic acid and lactic acid, a sulfonic acid such as sulfuric acid and p-toluene sulfonic acid, an acidic emulsifier such as alkylbenzenesulfonic acid, alkylsulfonic acid, alkylsulfosuccinic acid, polyoxyethylene alkyl sulfuric acid, polyoxyethylene alkylaryl sulfuric acid and polyoxyethylene distyryl phenyl ether sulfonic acid, acidic or weak acidic inorganic salt, phthalic acid, phosphoric acid and nitric acid; a basic compound such as sodium hydroxide, potassium hydroxide, sodium methylate, sodium acetate, tetramethylammonium chloride, tetramethylammonium hydroxide, tributyl amine, diazabicycloundecene, ethylene diamine, diethylene triamine, an ethanol amine, γ-aminopropyltrimethoxysilane and γ-(2-aminoethyl)-aminopropyltrimethoxysilane; and a tin compound such as dibutyltin octylate and dibutyltin dilaurate. Of these, a polymerization catalyst of a hydrolyzable silicon compound serving as the component (b1) is preferably an acidic emulsifier having a function of not only a polymerization catalyst but also an emulsifier, particularly, an alkylbenzenesulfonic acid (dodecyl benzene sulfonic acid and the like) having 5 to 30 carbon atoms.

As the polymerization catalyst for the component (b2), a radical polymerization catalyst is preferable, which causes radical decomposition by heat or a reducible substance and the like and causes addition polymerization of a vinyl monomer. Examples of such a radical polymerization catalyst preferably include a water soluble or oil soluble persulfate, peroxide and azobis compound. More specific example of the radical polymerization catalyst include potassium persulfate, sodium persulfate, ammonium persulfate, hydrogen peroxide, t-butyl hydroperoxide, t-butyl peroxybenzoate, 2,2-azobisisobutyronitrile, 2,2-azobis(2-diaminopropane) hydrochloride and 2,2-azobis(2,4-dimethylvaleronitrile).

The use amount of polymerization catalyst to 100 parts by mass of the total vinyl monomer is preferably 0.001 to 5 parts by mass. If a polymerization rate is desired to increase and polymerization is desired to perform at a temperature as low as 70° C. or less, it is advantageous if a reducing agent such as sodium bisulfite, ferrous chloride, ascorbate and Rongalite is used in combination with a radical polymerization catalyst.

In the embodiment, polymerization of the component (b1) and polymerization of the component (b2) can be separately performed; however, they are preferably performed simultaneously because micro organic/inorganic conjugation can be attained by a hydrogen bond and the like.

As a method for obtaining the component (B), so-called emulsion polymerization is suitable in which the component (b1) and the component (b2) are polymerized in the presence of a sufficient amount of water for the emulsifier to form a micelle. In an example of the emulsion polymerization method, the component (b1) and the component (b2), if necessary, further the component (b3) are added dropwise directly or in an emulsion state, at one time, in lots or continuously, to a reaction vessel and polymerized in the presence of a polymerization catalyst, at a pressure of preferably atmospheric pressure to 10 MPa, if necessary at a reaction temperature of about 30 to 150° C. However, polymerization may be performed, if necessary, at the aforementioned pressure or more or the aforementioned temperature or less.

The polymerization material solution is preferably prepared, in view of polymerization stability, by blending components (b1) to (b4) such that the total mass of the solid contents falls within the range of 0.1 to 70 mass % and preferably 1 to 55 mass %. The total mass (mass %) of the solid contents is obtained by placing and drying the component (B) in an oven heated to 100° C. for 2 hours to obtain the dry weight of the solid contents, and calculating in accordance with the following expression (II).

Total mass of solid contents (mass %)=dry mass/mass of component $(B)\times 100$     (II)

In carrying out the emulsion polymerization, in view of appropriately growing the particle or controlling the particle size of the resultant component (B), a seed polymerization method is preferably employed. In the seed polymerization method, an emulsion particle (seed particle) is previously placed in an aqueous phase and then polymerization is performed. The pH of the polymerization system when a seed polymerization method is carried out is preferably 1.0 to 10.0 and more preferably 1.0 to 6.0. The pH can be adjusted by use of a pH buffer such as disodium phosphate, borax, sodium hydrogen carbonate and ammonia.

As a method for obtaining the component (B), a method of polymerizing component (b1) and component (b2) in the presence of component (b3) and component (b4) required for polymerizing component (b1) and, if necessary, in the presence of a solvent, followed by adding water until a polymerization product is emulsified, can be applied.

The component (B) preferably has a core/shell structure having a core layer and one or two or more shell layers covering the core layer in view of improving the adhesion of the resultant coating film to a substrate. A method for forming the core/shell structure, multistage emulsion polymerization, in which emulsion polymerization is performed in multiple stages, is extremely useful. The core/shell structure can be observed, for example, by a morphological observation by means of a transmission electron microscope and the like and analysis by viscoelastic measurement.

The component (B) is a polymer emulsion particle obtained by polymerizing the component (b1) and the component (b2) in the polymerization material solution containing a seed particle forming the core layer. The seed particle is more preferably a particle obtained by polymerizing the component (b1), the component (b2) and the component (b5): at least one component selected from the group consisting of other vinyl monomers copolymerizable with the component (b2). Also in this case, multistage emulsion polymerization is useful.

The multistage emulsion polymerization specifically consists of e.g., a first stage of polymerizing, in the presence of the component (b3) and component (b4), the component (b1), the component (b2) and at least one component selected from the group consisting of the components (b5) to form a seed particle, and a second stage of polymerization is performed, in the presence of the seed particle, by adding a polymerization material solution containing the component (b1) and the component (b2), and, if necessary, the component (b5) (2-stage polymerization method). In the case where multistage emulsion polymerization consisting of three stages or more is performed, for example, polymerization of the third stage is performed by further adding a polymerization material solution containing the component (b1) and the component (b2) and, if necessary, the component (b5). Such a method is preferable in view of polymerization stability.

In the case where the two-stage polymerization method is employed, mass ratio ((M1)/(M2)) of the solid content mass (M1) in the polymerization material solution used in the first stage to the solid content mass (M2) in the polymerization material solution to be added in the second stage is preferably 9/1 to 1/9 and more preferably 8/2 to 2/8 in view of polymerization stability.

Furthermore, as the core/shell structure, in view of polymerization stability, it is preferable that a particle size is increased by the second-stage polymerization without significantly changing the size distribution (volume average particle size/number average particle size) of the seed particle. The volume average particle size can be measured in the same manner as in the number average particle size.

In the polymer emulsion particle (B), a mass ratio ((b2)/(b1)) of the content of the component (b2) to the content of the component (b1) in the core layer is preferably 0.01/1 to 1/1. In the outermost shell layer, a mass ratio ((b2)/(b1)) of the content of the component (b2) to the content of the component (b1) is preferably 0.01/1 to 5/1. In the core layer, if the mass ratio ((b2)/(b1)) is 0.01/1 or more, polymerization stability tends to be more improved, whereas if the mass ratio is 1/1 or less, durability and flexibility are further improved. Furthermore, In the outermost shell layer, if the mass ratio ((b2)/(b1)) is 0.01/1 or more, the interaction with the component (A) can be increased, whereas if the mass ratio is 5/1 or less, the interaction can be appropriately suppressed and sufficient stability tends to be obtained.

In the core/shell structure, the glass transition temperature (Tg) of the core layer is preferably 0° C. or less. This case is preferable since the coating film having more excellent flexibility at room temperature can be obtained, with the result that a protective member for a solar cell rarely generating crack and the like can be produced. Tg can be measured by a differential scanning calorimeter (DSC) in the embodiment.

A number average particle size of the component (B) is preferably 10 nm to 800 nm. If the composition is formed by comprising the component (B) whose particle size is controlled to fall within the range, in combination with the component (A) having a number average particle size of 1 nm to 400 nm, weather resistance and antifouling properties are further improved. In view of improving the transparency of the resultant coating film, a number average particle size of the component (B) is more preferably 10 nm to 100 nm.

The ratio ((SA)/(SB)) of the surface area (SA) of the component (A) to the surface area (SB) of the component (B) preferably falls within the range of 0.001 to 1000. The surface area of each component can be calculated based on particle sizes, mass values and specific gravity values of the component (A) and the component (B) and on the assumption that the shape of particles are true sphere.

In the embodiment, in addition to the aforementioned components, additional components usually added to a coating material and a molding resin can be blended depending upon the application and the method to be employed and the like. Examples thereof include a light stabilizer, a UV absorbent, a thickening agent, a leveling agent, a thixotropy agent, a defoaming agent, a freezing stabilizer, a delustering agent, a crosslinking reaction catalyst, a pigment, a curing catalyst, crosslinking agent, a filler, an antiskinning agent, a dispersant, a wetting agent, an antioxidant, a UV absorbent, a rheology controlling agent, a film-forming auxiliary, a rust preventing agent, a dye, a plasticizer, a lubricant, a reducing agent, an antiseptic agent, an antifungal agent, a deodorant, a yellowing inhibitor, an antistatic agent and a charge controller. They may be selected and used in combination depending upon the purpose.

As the light stabilizer, for example, hindered amine based light stabilizers are preferably used. Of them, a radical polymerizable light stabilizer having a radical polymerizable double bond within the molecule is preferable. As the UV absorbent, for example, an organic UV absorbent can be mentioned. Examples of such an organic UV absorbent include a benzophenone UV absorbent, a benzotriazole UV absorbent and a triazine UV absorbent. Of these, a radical polymerizable UV absorbent having a radical polymerizable double bond within the molecule is preferable. Furthermore, it is preferable to use a benzotriazole UV absorbent and a triazine UV absorbent having a high UV ray absorption ability.

The light stabilizer is preferably used in combination with an organic UV absorbent. Use of them in combination possibly contributes to an improvement of weather-resistance of the resultant coating film. Furthermore, the organic UV absorbent, light stabilizer and additional components can be simply blended with the component (A1), component (A2) and component (B) and may be co-present in synthesizing the component (B).

The coating composition of the embodiment preferably further comprises hydrolyzable silicon compound as the component (C) for the purpose of improving the strength and antifouling properties of the resultant coating film. As the hydrolyzable silicon-containing compound used as the component (C), at least one selected from the group consisting of a hydrolyzable silicon-containing compound (c1) represented by the following formula (1), a hydrolyzable silicon-containing compound (c2) represented by the following formula (2) and a hydrolyzable silicon compound (c3) represented by the following formula (3) can be used.

$$R^1{}_n SiX_{4-n} \quad (1)$$

where $R^1$ represents a hydrogen atom, or an alkyl group, alkenyl group, alkynyl group or aryl group having 1 to 10 carbon atoms and optionally having a halogen group, a hydroxy group, a mercapto group, an amino group, a (meth)acryloyl group or an epoxy group; X represents a hydrolyzable group; and n is an integer of 0 to 3. The hydrolyzable group is not particularly limited as long as it hydrolytically produces a hydroxy group and examples thereof include a halogen atom, an alkoxy group, an acyloxy group, an amino group, a phenoxy group and an oxime group.

$$X_3Si\text{---}R^2{}_n\text{---}SiX_3 \quad (2)$$

where X represents a hydrolyzable group; $R^2$ represents an alkylene group or phenylene group having 1 to 6 carbon atoms; and n is 0 or 1.

$$R^3\text{---}(O\text{---}Si(OR^3)_2)_n\text{---}OR^3 \quad (3)$$

where $R^3$ represents an alkyl group having 1 to 6 carbon atoms; and n is an integer of 2 to 8.

Specific examples of the hydrolyzable silicon compounds (c1) and (c2) include tetramethoxysilane, tetraethoxysilane, tetra(n-propoxy)silane, tetra(i-propoxy)silane, tetra(n-butoxy)silane, tetra(i-butoxy)silane, tetra-sec-butoxysilane, tetra-tert-butoxysilane, trimethoxysilane, triethoxysilane, methyltrimethoxysilane, methyltriethoxysilane, ethyltrimethoxysilane, ethyltriethoxysilane, propyltrimethoxysilane, propyltriethoxysilane, isobutyltriethoxysilane, cyclohexyltrimethoxysilane, phenyltrimethoxysilane, phenyltriethoxysilane, dimethoxysilane, diethoxysilane, methyldimethoxysilane, methyldiethoxysilane, dimethyldimethoxysilane, dimethyldiethoxysilane, bis(trimethoxysilyl)methane, bis(triethoxysilyl)methane, bis(triphenoxysilyl)methane, bis(trimethoxysilyl)ethane, bis(triethoxysilyl)ethane, bis(triphenoxysilyl)ethane, 1,3-bis(trimethoxysilyl)propane, 1,3-bis(triethoxysilyl)propane, 1,3-bis(triphenoxysilyl)propane, 1,4-bis(trimethoxysilyl)benzene, 1,4-bis(triethoxysilyl)benzene, 3-chloropropyltrimethoxysilane, 3-chloropropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-glycidoxypropyltrimethoxysilane, 3-glycidoxypropyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, tetraacetoxysilane, tetrakis(trichloroacetoxy)silane, tetrakis(trifluoroacetoxy)silane, triacetoxysilane, tris(trichloroacetoxy)silane, tris(trifluoroacetoxy)silane, methyltriacetoxysilane, methyltris(trichloroacetoxy)silane, tetrachlorosilane, tetrabromosilane, tetrafluorosilane, trichlorosilane, tribromosilane, trifluorosilane, methyltrichlorosilane, methyltribromosilane, methyltrifluorosilane, tetrakis(methylethylketoxime)silane, tris(methylethylketoxime)silane, methyl tris(methylethylketoxime)silane, phenyl tris(methylethylketoxime)silane, bis(methylethylketoxime)silane, methyl bis(methylethylketoxime)silane, hexamethyldisilazane, hexamethylcyclotrisilazane, bis(dimethylamino)dimethylsilane, bis(diethylamino)dimethylsilane, bis(dimethylamino)methylsilane and bis(diethylamino)methylsilane.

Specific examples of the hydrolyzable silicon compound (c3) represented by the above formula (3) include a partial hydrolytic condensate of tetramethoxysilane (for example, trade name "M silicate 51" manufactured by Tama Chemicals Co., Ltd.; trade name "MSI51" manufactured by Colcoat Co., Ltd.; and trade name "MS51" and "MS56" manufactured by Mitsubishi Chemical Corporation), a partial hydrolytic condensate of tetraethoxysilane (trade name "Silicate 35" and "Silicate 45" manufactured by Tama Chemicals Co., Ltd.; and trade name "ESI40" and "ESI48" manufactured by Colcoat Co., Ltd.) and a partial hydrolytic condensate between tetramethoxysilane and tetraethoxysilane (trade name "FR-3" manufactured by Tama Chemicals Co., Ltd.; and trade name "EMSi48" manufactured by Colcoat Co., Ltd.).

The mass ratio ((A1+A2)/B) of the total content of the component (A1) and the component (A2) to the content of the component (B) is not particularly limited; however, in view of total light transmittance and infrared absorption, the mass ratio is preferably 60/100 to 1000/100, more preferably 100/100 to 500/100 and further preferably 120/100 to 300/100.

The mass ratio ((A2)/(B+A1)) of the content of the component (A2) to the total content of the component (B) and the component (A1) is, in view of total light transmittance of the coating film, preferably 0.05/100 to 40/100, more preferably 0.1/100 to 20/100 and further preferably 0.1/100 to 10/100.

The mass ratio ((b2)/(B)) of the content of the component (b2) to the content of the component (B) is, in view of polymerization stability, preferably 0.01/1 to 1/1, more preferably 0.1/1 to 0.8/1 and further preferably 0.2/1 to 0.5/1.

The mass ratio ((b2)/(A)) of the content of the component (b2) to the content of the component (A) is, in view of improving hydrogen bonding ability to a meal oxide, preferably 0.01/1 to 1/1, more preferably 0.05/1 to 0.8/1 and further preferably 0.1/1 to 0.4/1.

Since the component (A2) relatively causes secondary coagulation more easily than the component (A1), if the mass ratio ((A2)/(A1+B)) of the content of the component (A2) to the total content of the component (B) and the component (A1) is set to be 40/100 or less, the transparency of a coating film can be increased and a reduction of light transmittance by scattering can be suppressed. If the ratio ((A2)/(A1+B)) of the content of the component (A2) to the total content of the component (B) and the component (A1) is set to be 0.05/100 or more, infrared absorption by the coating-film surface can be increased and a temperature increase of silicon can be suppressed, thereby improving power generation efficiency.

The mass ratio ((A)/(B)) of the component (A) to the component (B) is, in view of hydrophilicity and film formation properties, preferably 110/100 to 480/100, more preferably 110/100 to 300/100 and further preferably 150/100 to 250/100. If the ratio is set to be the above range, antifouling properties, transparency and hydrophilicity can be further improved and shock resistance/durability and the hydrophilicity of the coating-film surface at high temperature, high humidity or high-temperature/high-humidity can be rendered to be superior.

The mass ratio ((C)/(A)) of the component (C) to the component (A) is preferably 1/100 to 150/100, more preferably 10/100 to 120/100 and further preferably 40/100 to 120/100. If the ratio of (C)/(A) is 1/100 or more, hydrophilicity tends to be maintained even under high temperature conditions and high humidity conditions. If the ratio of (C)/(A) is 150/100 or less, the shock resistance of the resultant coating film tends to be possibly more improved.

The component (A) preferably comprises silica having a number average particle size of 1 nm to 400 nm as the component (A1) and an infrared absorbent having a number average particle size of 1 nm to 2000 nm as the component (A2). The component (A1), while interacting with the component (B), can be present between particles of the component (B) in the form of a continuous phase. As a result, silica particles having high hydrophilicity are present in the outermost surface of the coating film. Therefore, high hydrophilicity can be obtained immediately after formation of the coating film regardless of light irradiation, and simultaneously, heat resistance, transparency and weather-resistance can be more improved. In this case, it is preferable that the mass ratio ((A1+A2)/(B)) of the total content of the component (A1) and the component (A2) to the content of the component (B) is preferably 60/100 to 1000/100 and that the mass ratio ((A2)/(A1+B)) of the content of the component (A2) to the total content of the component (B) and the component (A1) is preferably 0.05/100 to 40/100.

The component (A) preferably comprises component (A1): silica having a number average particle size of 1 nm to 400 nm and component (A3): a photocatalyst having a number average particle size of 1 nm to 2000 nm. The component (A1), while interacting with the component (B), can be present between particles of the component (B) in the form of a continuous phase. As a result, silica particles having high hydrophilicity are present in the outermost surface of the coating film. Therefore, high hydrophilicity can be obtained immediately after formation of the coating film regardless of light irradiation, and simultaneously, transparency and weather-resistance can be more improved. In this case, the mass ratio ((A1+A3)/(B)) of the total content of the component (A1) and the component (A3) to the component (B) is 60/100 to 480/100 and the mass ratio ((A1)/(A1+A3)) of the content of the component (A1) to the total content of the component (A1) and the component (A3) is more preferably 85/100 to 99/100.

(Application of Coating Composition)

The coating film resulting from the coating composition of the embodiment is excellent in antifouling properties, transparency, hydrophilicity and durability (shock resistance) and further can maintain surface hydrophilicity even at high temperature, high humidity or high-temperature/high-humidity. Because of this, the coating composition can be preferably used in various applications. In addition to these properties, other properties can be added if necessary as described above, and thus, the coating composition can be preferably used in various applications, for example, antireflection use, solvent resistance use, antistatic use, heat resistance use and hard coating use.

(the Case of Antireflection Coating Composition)

In the coating composition of the embodiment, the curing time is not excessively long and restriction on the types of substrates to be used can be eased. Furthermore, the resultant coating film is excellent in light resistance, abrasion resistance and excellent durability. Since these advantages can be added, the coating composition of the embodiment can be suitably used as an antireflection coating composition. The antireflection coating composition can be preferably used in various display panels such as a liquid crystal display panel, a cold cathode-ray tube panel and a plasma display, displays used in the open air such as an advertising display and electrical scoreboards, as an antireflection film for preventing reflection of outer light and simultaneously improving image quality.

A preferable aspect of an antireflection coating composition and members using the same will be described below. If the composition further satisfies the following conditions, not only properties such as antifouling properties, transparency and hydrophilicity but also antireflection performance can be added to the resultant coating film.

(1)

It is preferable that the antireflection coating composition comprises as the component (A), a metal oxide particle having a number average particle size of 1 nm to 400 nm, and as the component (B), a polymer emulsion particle having a number average particle size of 10 nm to 800 nm, in which the component (B) is a polymer emulsion particle obtained by polymerizing a polymerization material solution containing the components (b1) to (b4); and the mass ratio ((A)/(B)) of the component (A) to the component (B) is 50/100 to 450/100.

Particularly, the component (A) that is used is preferably at least one selected from the group consisting of silica (A1), a photocatalyst (A3) and a conductive metal oxide (A4) as mentioned above. Advantages obtained by using these components are as mentioned above. In addition to this, in the case where the photocatalyst (A3) is used, photocatalyst activity and hydrophilicity can be exhibited by light irradiation. As a result, an excellent activity to decompose organic staining substances and fouling resistance of the coating surface can be further significantly exhibited.

(2)

In the above item (1), it is preferable that the mass ratio ((b2)/(B)) of the component (b2) to the component (B) is 0.1/1 to 0.5/1.

(3)

In the above item (1) or (2), it is preferable that the mass ratio ((b2)/(A)) of the component (b2) to the component (A) is 0.1/1 to 1/1.

(4)

In any one of the above items (1) to (3), it is preferable that the component (B) has a core/shell structure having a core layer and one or two or more shell layers covering the core layer.

(5)

In the core layer according to the above item (4), it is preferable that the mass ratio ((b2)/(b1)) of the component (b2) to the component (b1) is 0.01/1 to 1/1, and that the mass ratio ((b2)/(b1)) of the component (b2) to the component (b1) in the outermost shell layer is 0.1/1 to 5/1.

(6)

In the above item (4) or (5), it is preferable that the component (B) can be obtained by polymerizing a polymerization material solution in the presence of a seed particle forming a core layer and that the seed particle is obtained by polymerizing at least one selected from the group consisting of the component (b1), component (b2) and a vinyl monomer copolymerizable with the component (b2).

(7)

In any one of the above items (1) to (6), it is preferable that the component (b2) is a vinyl monomer having a secondary amide group, a tertiary amide group or both of them.

(8)

In any one of the above items (1) to (7), it is preferable that the particle size of the component (B) is 120 to 450 nm.

(9)

In any one of the above items (1) to (8), it is preferable that the aforementioned component (C) is further contained.

(10)

An antireflection composite can be provided from the antireflection coating composition.

(11)

An antireflection composite containing the antireflection coating composition can be provided.

(12)

A display containing the antireflection composite can be provided.

(13)

An exterior display member containing the antireflection composite can be provided.

(The Case of Solvent Resistant Coating Composition)

In the coating composition of the embodiment, since the component (A) and the component (B) tend to interact with each other, the resultant coating film is excellent in not only antifouling properties, transparency and hydrophilicity but also in weather resistance and the like. Because of these advantages thus added, the coating composition can be preferably used also as a solvent resistant coating composition. An industrial product is generally washed with a solvent such as an alcohol in a manufacturing step and product assembly and installation step. Therefore, solvent resistance is required. In the case of, for example, optical parts such as an optical lens, surface stain is wiped out with isopropyl alcohol and the like. At that time, if optical parts do not have solvent resistance, the surface is dissolved and optical characteristics such as transparency deteriorate. Therefore, the coating composition of the embodiment can be preferably used as a coating composition for adding solvent resistance to such a product.

A preferable aspect of the solvent resistant coating composition and a member using the same will be described below. If the composition further satisfies the following conditions, not only transparency, hydrophilicity, antifouling properties and the like but also solvent resistance can be added to the resultant coating film.

(1)

It is preferable that the solvent resistant coating composition comprises as the component (A), a metal oxide particle having a number average particle size of 1 nm to 400 nm, and as the component (B), a polymer emulsion particle having a number average particle size of 10 nm to 800 nm, in which the component (B) is a polymer emulsion particle obtained by polymerizing a polymerization material solution containing the components (b1) to (b4); and the mass ratio ((A)/(B)) of the component (A) to the component (B) 50/100 to 300/100.

(2)

In the above item (1), it is preferable that the mass ratio ((b2)/(B)) of the component (b2) to the component (B) is 0.1/1 to 0.5/1.

(3)

In the above item (1) or (2), it is preferable that the mass ratio ((b2)/(A)) of the component (b2) to the component (A) is 0.1/1 to 1/1.

(4)

In any one of the above items (1) to (3), it is preferable that the component (B) has a core/shell structure having a core layer and one or two or more shell layers covering the core layer.

(5)

In the core layer according to the above item (4), it is preferable that the mass ratio ((b2)/(b1)) of the component (b2) to the component (b1) is 0.01/1 to 1/1, and that the mass ratio ((b2)/(b1)) of the component (b2) to the component (b1) in the outermost shell layer is 0.1/1 to 5/1.

(6)

In the core layer according to the above item (4) or (5), it is preferable that the component (B) can be obtained by polymerizing a polymerization material solution in the presence of a seed particle forming a core layer and that the seed particle is obtained by polymerizing at least one selected from the group consisting of the component (b1), component (b2) and a vinyl monomer copolymerizable with the component (b2).

(7)

In any one of items (1) to (6), it is preferable that the component (b2) is a vinyl monomer having a secondary amide group, a tertiary amide group or both of them.

(8)

In any one of items (1) to (7), it is preferable that the number average particle size of the component (B) is 20 to 250 nm.

(9)

In any one of items (1) to (8), it is preferable that the component (C) is further contained.

(10)

A solvent resistant composite can be provided from the solvent resistant coating composition.

(11)

A solvent resistant composite containing the solvent resistant coating composition can be provided.

(12)

A display containing the solvent resistant composite can be provided.

(13)

An exterior display member containing the solvent resistant composite can be provided.

(14)

A transparent plastic for a window containing the solvent resistant composite can be provided.

(15)

A transparent protective material for photovoltaic power generation containing the solvent resistant composite can be provided.

(the Case of Antistatic Coating Composition)

In the coating composition of the embodiment, since a conductive metal oxide can be used as the component (A), antistatic properties can be added to the resultant coating film. By virtue of this, the coating composition of the embodiment can be used as an antistatic coating composition. A preferable aspect of the antistatic coating composition and a member using the same will be described below. Particularly, as the component (A), at least one selected from the group consisting of silica (A1), photocatalyst (A3) and conductive metal oxide (A4) as mentioned above is more preferably used. Advantages of using these components are as mentioned above. If the following conditions are satisfied, not only antifouling properties, transparency, hydrophilicity and the like but also antistatic performance can be added to the resultant coating film.

(1) It is preferable that the antistatic coating composition preferably comprises as the component (A), a metal oxide particle having a number average particle size of 1 nm to 400 nm, and as the component (B), a polymer emulsion particle having a number average particle size of 10 nm to 800 nm, in which the component (B) is a polymer emulsion particle obtained by polymerizing a polymerization material solution containing the components (b1) to (b4); and the mass ratio ((A)/(B)) of the component (A) to the component (B) is 150/100 to 450/100.

(2)

In the above item (1), it is preferable that the mass ratio ((b2)/(B)) of the component (b2) to the component (B) is 0.1/1 to 0.5/1.

(3)

In the above item (1) or (2), it is preferable that the mass ratio ((b2)/(A)) of the component (b2) to the component (A) is 0.1/1 to 1/1.

(4)

In any one of the above items (1) to (3), it is preferable that the component (B) has a core/shell structure having a core layer and one or two or more shell layers covering the core layer.

(5)

In the core layer according to above item (4), it is preferable that the mass ratio ((b2)/(b1)) of the component (b2) to the component (b1) is 0.01/1 to 1/1, and that the mass ratio ((b2)/(b1)) of the component (b2) to the component (b1) in the outermost shell layer is 0.1/1 to 5/1.

(6)

In the core layer formed of the antistatic coating composition according to item (4) or (5), it is preferable that the component (B) can be obtained by polymerizing a polymerization material solution in the presence of a seed particle forming a core layer, and that the seed particle is obtained by polymerization of at least one selected from the group consisting of the component (b1), component (b2) and a vinyl monomer copolymerizable with the component (b2).

(7)

In any one of items (1) to (6), it is preferable that the component (b2) is a vinyl monomer having a secondary amide group, a tertiary amide group or both of them.

(8)

In any one of items (1) to (7), it is preferable that the number average particle size of the component (B) is 50 to 350 nm.

(9)

In any one of items (1) to (8), it is preferable that the component (C) mentioned above is further contained in the antistatic coating composition, in which the mass ratio ((A)/(B)) of the component (A) to the component (B) is 150/100 to 350/100 and the mass ratio ((C)/(A)) of the component (C) to the component (A) is preferable 0.5/100 to 110/100.

(10)

An antistatic composite can be provided from the antistatic coating composition.

(11)

An antistatic composite containing the antistatic coating composition can be provided.

(12)

A display containing the antistatic composite can be provided.

(13)

An exterior display member containing the antistatic composite can be provided.

(14)

A transparent plastic for a window containing the antistatic composite can be provided.

(15)

A transparent protective material for photovoltaic power generation containing the antistatic composite can be formed.

(The Case of Heat Resistant Coating Composition)

In the coating composition of the embodiment, since an infrared absorbent (A2) can be used as the component (A), heat resistance performance/thermal insulation performance can be also added to the resultant coating film. By virtue of this, the coating composition of the embodiment can be used also as a thermal insulation coating composition. Particularly, as the component (A), it is more preferable to use at least one selected from the group consisting of silica (A1), the infrared absorbent (A2), the photocatalyst (A3) and the conductive metal oxide (A4). Advantages of using these components are as mentioned above. If the following conditions are satisfied, not only transparency, hydrophilicity, antifouling properties and the like but also heat resistance/thermal insulation performance can be added to the resultant coating film.

(1)

A heat resistant coating composition comprises as the component (A1), silica having a number average particle size of 1 nm to 400 nm, as the component (A2), an infrared absorbent having a number average particle size of 1 nm to 2000 nm, and as the component (B), a polymer emulsion particle having a number average particle size of 10 nm to 800 nm.

(2)

In the above item (1), it is preferable that the component (A2) is at least one selected from the group consisting of indium oxide doped with tin, tin oxide doped with antimony, and cerium oxide or zinc oxide optionally coated with silica.

(3)

In the above item (1) or (2), it is preferable that the component (B) is a polymer emulsion particle obtained by polymerizing, in a polymerization material solution containing the component (b1) to component (b4), the component (b1) and the component (b2).

(4)

In any one of the above items (1) to (3), it is preferable that the mass ratio ((A1+A2)/(B)) of the total content of the component (A1) and the component (A2) to the content of the component (B) is 60/100 to 1000/100; and the mass ratio ((A2)/(B+A1)) of the content of the component (A2) to the total content of the component (B) and the component (A1) is 0.05/100 to 40/100.

(5)

In the above items (1) to (4), it is preferable that the mass ratio ((b2)/(B)) of the content of the component (b2) to the content of the component (B) is 0.1/1 to 0.5/1.

(6)

In the above items (1) to (5), it is preferable that the mass ratio ((b2)/(A1)) of the content of the component (b2) to the content of the component (A1) is 0.1/1 to 1/1.

(7)

In the above items (1) to (6), it is preferable that the component (B) has a core/shell structure having a core layer and one or two or more shell layers covering the core layer.

(8)

In the core layer of the above item (7), it is preferable that the mass ratio ((b2)/(b1)) of the content of the component (b2) to the content of the component (b1) is 0.01/1 to 1/1; and in the outermost shell layer, the mass ratio ((b2)/(b1)) of the content of the component (b2) to the content of the component (b1) is 0.1/1 to 5/1.

(9)

In the above item (7) or (8), it is preferable that the component (B) is a polymer emulsion particle obtained by polymerizing the component (b1) and the component (b2) in a polymerization material solution containing a seed particle forming the core layer; and the seed particle is obtained by polymerizing at least one selected from the group consisting of the component (b1), component (b2), component (b5): a vinyl monomer copolymerizable with the component (b2).

(10)

In the above items (3) to (9), it is preferable that the component (b2) is a vinyl monomer having a secondary amide group, a tertiary amide group or both of them.

(11)

In the above items (1) to (10), it is preferable that a component (C) is further contained, and the mass ratio ((C)/(A1)) of the content of the component (C) to the content of the component (A1) is preferably 1/100 to 100/100.

(12)

In the above items (1) to (11), it is preferable that the component (B) has a number average particle size of 10 to 100 nm.

(13)

In the above items (1) to (12), it is preferable that the component (A1) is colloidal silica having a number average particle size of 1 nm to 400 nm.

(14)

In the above items (1) to (13), it is preferable that the component (A2) has an absorbance of 0.1% or more within the wavelength region of 1000 nm to 2500 nm.

(15)

A solar cell member having a substrate and a coating film formed by applying the heat resistant coating composition onto the substrate, followed by drying can be provided. The solar cell member can be used as a solar cell protective member.

(the Case of Coating Composition for Hard Coating)

In the coating composition of the embodiment, curing time is not excessively long and restriction on the types of substrates to be used can be eased. Furthermore, the resultant coating film is excellent in light resistance, abrasion resistance and durability. Since these advantages can be added, the coating composition of the embodiment can be preferably used also as a coating composition for hard coating. A preferable aspect of the coating composition for hard coating and members using the same will be described below. If the following conditions are satisfied, not only antifouling properties, transparency, hydrophilicity and the like but also hard coating performance can be added to the resultant coating film.

(1)

It is preferable that the coating composition for hard coating comprises as the component (A), a metal oxide particle having a number average particle size of 1 nm to 400 nm, and as the component (B), a polymer emulsion particle having a number average particle size of 10 nm to 800 nm, in which the component (B) is a polymer emulsion particle obtained by polymerizing a polymerization material solution containing the components (b1) to (b4); and the mass ratio ((A)/(B)) of the component (A) to the component (B) is 50/100 to 350/100.

(2)

In the above item (1), it is preferable that the mass ratio ((b2)/(B)) of the component (b2) to the component (B) is 0.1/1 to 0.5/1.

(3)

In the above item (1) or (2), it is preferable that the mass ratio ((b2)/(A)) of the component (b2) to the component (A) is 0.1/1 to 1/1.

(4)

In any one of the above items (1) to (3), it is preferable that the component (B) has a core/shell structure having a core layer and one or two or more shell layers covering the core layer.

(5)

In the core layer according to the above item (4), it is preferable that the mass ratio ((b2)/(b1)) of the component (b2) to the component (b1) is 0.01/1 to 1/1, and that the mass ratio ((b2)/(b1)) of the component (b2) to the component (b1) in the outermost shell layer is 0.1/1 to 5/1.

(6)

In the above item (4) or (5), it is preferable that the component (B) can be obtained by polymerizing a polymerization material solution in the presence of a seed particle forming a core layer, and that the seed particle is obtained by polymerizing at least one selected from the group consisting of the component (b1), component (b2) and a vinyl monomer copolymerizable with the component (b2).

(7)

In any one of the above items (1) to (6), it is preferable that the component (b2) is a vinyl monomer having a secondary amide group, a tertiary amide group or both of them.

(8)

In any one of items (1) to (7), it is preferable that the number average particle size of the component (B) is 50 to 250 nm.

(9)

In any one of the above items (1) to (8), it is preferable that the component (C) mentioned above is further contained and the mass ratio ((A)/(B)) of the component (A) to the component (B) is 50/100 to 350/100, and the mass ratio ((C)/(A)) of the component (C) to the component (A) is 5/100 to 90/100.

(10)

A hard coating composite can be provided from the coating composition for hard coating.

(11)

A hard coating composite containing the coating composition for hard coating can be provided.

(12)

A display containing the hard coating composite can be provided.

(13)

An exterior display member containing the hard coating composite can be provided.

(14)

A traffic window containing the hard coating composite can be provided.

(15)

A transparent protective material for use in photovoltaic power generation containing the hard coating composite can be provided.

A coating film can be obtained from the coating composition of the embodiment. A method for forming the coating film of the embodiment is not limited and a known method for forming a coating film from a coating solution can also be employed. For example, a coating film can be formed by applying a coating composition dispersed in water, an organic solvent and the like onto an object on which the film is to be formed (for example, a substrate) followed by drying. More specifically, a coating film having a plurality of layers can be also formed by repeating a process of applying the coating composition followed by drying. In this case, a coating composition is first applied onto e.g., a substrate and dried to obtain a single layer. Thereafter, the coating composition is further applied onto the layer (i.e., recoating) and dried to form another layer, and if necessary, this operation is repeated. By employing such a method, the coating film having a plurality of layers stacked can be obtained.

Another aspect of the coating film of the embodiment, there is provided a coating film having a metal oxide particle (A) and a polymer particle (B) surrounded by the component (A), in which the surface of a film formed of component (B2) extracted from the component (B) by ultrafiltration and having a molecular cutoff of 50,000 or less has a water contact angle of 30° or less.

It is satisfactory if the surface of a dry film formed of component (B2) extracted from the component (B) and having a molecular cutoff of 50,000 or less has a surface contact angle with water of larger than 30° at 20° C., and the compositions and the like of component (A), component (B) and component (B2) are not particularly limited. For example, the aforementioned component (A) and component (B) may be employed. The surface contact angle used herein refers to an angle between the dry film and a tangent line of a water drop present on the surface and can be measured by a drop method.

In the coating film, it is preferable that the content of the component (B2) is 5 mass % or less. If the content of the aforementioned aqueous-phase component is controlled to be 5 mass % or less, the distribution coefficient to a water medium falls within a predetermined range. As a result, high surface hydrophilicity can be maintained even at high temperature, high humidity and further at high temperature/high humidity.

In the coating film of the embodiment, a polymer particle (B) may be surrounded by a metal oxide particle (A). As a dispersion structure, a sea-island structure is preferred. To describe more specifically the component (A) may present like a sea phase, whereas the component (B) may present like an island phase. It is preferable that the component (A) is present between the particles of the component (B) in the form of a continuous phase, while mutually interacting with the component (B). In this case, the reflectivity, weather resistance and antifouling properties of the resultant coating composition can be improved.

Furthermore, the component (B) is preferably the aforementioned emulsion particle. The emulsion particle is preferably the aforementioned polymer emulsion particle (B1). As the emulsion particle or polymer emulsion particle, the aforementioned ones can be used.

A preferable aspect of the embodiment is a coating film having a water contact angle with a surface of 20° at 20° C.

Furthermore, after a high-temperature/high-humidity test in which a film is allowed to stand still at 90° C. under the conditions of a humidity 90% for 24 hours, the water contact angle of the coating-film surface is preferably 20° or less. After the high-temperature/high-humidity test, the water contact angle of the coating-film surface is measured by the method described in Examples described later. The temperature and humidity to be used in the test, can be controlled by a method using a known high-temperature/high-humidity tester, for example, SH-661 manufactured by ESPEC Corp. Alternatively, a sealed container charged with distilled water, heated at a predetermined temperature to produce saturated vapor, which is used for evaluation.

<Laminate>

A laminate can be obtained from the coating film and coating composition of the embodiment. FIG. 1 is a schematic sectional view of a laminate according to the embodiment. A laminate 1 of the embodiment has a substrate 10 and a coating film 12, which is formed by applying the aforementioned coating composition onto at least one of the surfaces of the substrate 10.

Examples of a method for forming a coating film using the coating composition of the embodiment include, but not particularly limited to, a method for forming a coating film by applying a coating composition onto a substrate followed by drying. In this case, the solid content concentration of the coating composition is preferably 0.01 to 60 mass % and more preferably 1 to 40 mass %. The viscosity (20° C.) of the coating composition is preferably 0.1 to 100000 mPa·s and more preferably 1 to 10000 mPa·s.

Examples of a coating method of applying a coating composition to a substrate include, but not particularly limited to, a spray method, a flow coating method, a roll coating method, a bar coating method, a brush coating method, a dip coating method, a spin coating method, a screen coating method, a casting method, a gravure printing method, and a flexo printing method. Regarding the laminate of the embodiment, after a coating film is formed on a substrate, if desired, a heat treatment and UV rays may be applied. The temperature of the heat treatment is not particularly limited; however, the temperature is preferably 20° C. to 500° C. and more preferably 40° C. to 250° C.

In the embodiment, the coating film may have a single layer or two or more layers. A plurality of layers are preferable since a plurality of functions can be added to a laminate. A laminate having a plurality of coating films is formed, for example, by a recoating method for a coating composition as mentioned above.

The substrate is not particularly limited; however, it preferably contains at least one selected from the group consisting of glass, an acrylic resin, a polycarbonate resin, a cyclic polyolefin resin, a polyethylene terephthalate resin and an ethylene-fluoroethylene copolymer. From these resins, a preferable material can be appropriately selected depending upon desired properties. More specifically, in view of transparency, weather resistance and reduction in weight, it is preferable to use at least one selected from the group consisting of glass, an acrylic resin, a polycarbonate resin, a cyclic olefin resin, a polyethylene terephthalate resin and an ethylene-fluoroethylene copolymer or a composite material of these. Furthermore, in view of adding weather-resistance, a weather resistant agent and the like may be further kneaded in an acrylic resin, a polycarbonate resin, a cyclic polyolefin resin, a polyethylene terephthalate resin and an ethylene-fluoroethylene copolymer. The substrate may be formed of a single layer and a plurality of layers.

The thickness of the coating film is preferably 0.05 µm to 100 µm and more preferably 0.1 µm to 10 µm. In view of transparency, the thickness is preferably 100 µm or less. To exert a function such as weather-resistance and antifouling properties, the thickness is preferably 0.05 µm or more.

In the case where a coating film is formed of two or more layers, the thickness (dn) of each layer is preferably 10 nm to 800 nm, and the total thickness ($\Sigma$dn) of the coating film is more preferably 100 nm to 4000 nm. If the thickness ratio falls within the above range, higher light transmittance than that of a substrate and a singly-layer coating film can be obtained. If any one of the multiple layers has a thickness (dn) of 10 nm or more, the film thickness can be easily controlled. Even if a coating film is formed on an uneven substrate surface, the unevenness of the coating film can be effectively suppressed. Furthermore, if any one of the layers has a thickness (dn) of 800 nm or less, high light transmittance can be maintained. The total thickness (Σdn) of multiple layers varies depending upon the thickness of each of the layers constituting the coating film. If the total thickness (Σdn) is 100 nm or more, the thickness of a single layer can be ensured and thus, the film thickness can be easily controlled. Furthermore, if the total thickness (Σdn) of the multiple layers is 4000 nm or less, high level light transmittance can be exhibited compared to a coating film formed of a single layer having the same film thickness.

In the case where a coating film (laminate) formed of two or more layers, a laminate having the total thickness (Σdn) of the coating film in the range of 100 nm to 4000 nm and the thickness (dn) of each layer in the range of 10 nm to 800 nm layer is obtained by, for example, a method of suppressing a solid content concentration in a coating composition of the embodiment and serving as a raw material, for example, within 1 to 10 mass %. If the solid content concentration is suppressed within the above range, the total thickness of the coating film can be controlled within the above range.

The present inventors have intensively studies about the thickness of a layer of a coating-film laminate formed of a plurality of layers and the like. As a result, they found that if the thickness (dn and Σdn) of the coating film layer is set to fall within in the range, light transmittance higher than that of the substrate and a single-layer coating film can be obtained. Furthermore, they found that the coating composition serving as a raw material for a coating film is diluted with water so as to obtain a solid content concentration of, preferably, 1 to 10 mass %, the light transmittance can be effectively improved. The reasons of these are not yet elucidated in detail; however, one of the reasons is conceivably as follows.

More specifically, to obtain a coating film having the aforementioned layer thickness, it is desirable that the solid content concentration of a coating composition as raw material is reduced up to, for example, 1 to 10 mass %. This is because if the solid content concentration is set to fall within the aforementioned range, the total thickness of a laminate consisting of a plurality of layers can fall within the range. In contrast, the component (A), the component (B) and the like conceivably have a concentration and pH at which a solid particle is present in a stably dispersed state; however, if the coating composition is diluted preferably rapidly with water or a dilution solvent such as an alcohol, it is presumable that the dispersion state is no longer stable and a certain type of association and soft aggregate are formed. Then, if a coating film consisting of a plurality of layers is formed by using a coating composition having an association and a soft aggregation stably formed therein, e.g., the porosity of the coating film increases. Hence, light transmittance conceivably increases.

In the embodiment, it is preferable that the light transmittance of a laminate is higher than light transmittance of the substrate. By virtue of this, if such a laminate is used as a member of an energy conversion apparatus such as a solar cell, energy output of the energy conversion apparatus such as a solar cell can be improved. Note that light transmittance in the embodiment is measured in accordance with the method described in Examples described later. The light transmittance of a substrate is preferably 30% to 99%, more preferably, 70% to 99% and further preferably 80% to 99%. If the light transmittance of a substrate falls within the range, a solar cell having a practically high output can be obtained. The light transmittance can be measured in accordance with JIS K7105.

In the embodiment, it is preferable that the refractive index of the coating film is 0.1 or more lower than the refractive index of the substrate. By virtue of this, the light transmittance can be improved. In the case where the coating film has two or more layers, it is preferable that the refractive index of the outermost surface layer upon which sunlight is incident is 0.1 or more lower than the refractive index of the layer adjacent to the outermost surface layer. By virtue of this, refractive index decreases stepwise from a sunlight incident side toward a substrate. As a result, reflection upon the coating-film surface is suppressed and the light transmittance can be improved. Reflectivity is measured in accordance with the method described in Examples described later.

In the embodiment, it is preferable that difference in refractive index between the coating film and the substrate is 0.2 or less. If the difference in refractive index falls within the range or less, the same refractive properties as that of the substrate can be obtained. As a result, reflectivity can be increased to efficiently collect solar heat. The refractive index is measured in accordance with the method described in Examples described later.

In the embodiment, the refractive index of the coating film is preferably 1.30 to 1.48 and more preferably 1.34 to 1.43. Furthermore, it is preferable that both the refractive index of the coating film and the refractive index of the outermost surface layer fall within the range mentioned above. The refractive indexes of the coating film and the outermost surface layer can be selected depending upon the type of substrate, thickness and shape. If the refractive index of the coating film is 1.30 or more, the strength of the coating film tends to increase. If the refractive index of the coating film is 1.48 or less, light scattering can be suppressed and in particular, a haze value tends to be possibly reduced.

The ratio (Rc/Rb) of reflectivity (Rc) of the surface (S1) of a coating film opposite to a substrate to reflectivity (Rb) of the surface (S2) of the substrate on the coating film side is preferably 98% or more, more preferably 99.5% or more and further preferably, 99.7% or more (see FIG. 1). Furthermore, a reduction rate ((Rb−Rc)/Rb) of reflectivity (Rc) to reflectivity (Rb) is preferably 2% or less, preferably 0.5% or less, and more preferably 0.3% or less.

In the case where a laminate is obtained by recoating to have a film with a predetermined thickness obtained by coating, the reflectivity (Rc) of the coating film tends to be lower than the reflectivity (Rb) of the substrate by light absorption by the coating film itself, light scattering in the interface between the substrate and the coating film and between mutual coating films and the like. In particular, if a substrate having a high reflectivity (Rb) is used, the tendency is significant. The laminate of the embodiment using an organic/inorganic composite coating film, even if coating films are stacked repeatedly by recoating, a reduction rate of reflectivity (Rc) to reflectivity (Rb) can be suppressed within 2% or less. The reflectivity may further reduce; however it is preferably 2% or less in view of energy efficiency.

Furthermore, it is preferable that the reflectivity (Rb) is 80% or more. By virtue of this, sunlight can be efficiently collected and power generation cost of an apparatus can be reduced.

As the method for manufacturing a laminate according to the embodiment, any method may be used as long as a coating film is formed on a substrate, and a known method can be also employed. Preferably, it is possible to employ a manufacturing method having the steps of forming a coating film on at least one of the surfaces of a substrate by applying the coating composition of the embodiment and applying a heat treatment of 70° C. or more, a pressurization treatment at 0.1 kPa or more or both of them to the coating film. In the step of forming a coating film using the coating composition of the embodiment, as a method for obtaining the coating film of the embodiment, the aforementioned method can be employed. Then, if the resultant coating film is subjected to a step of applying a heat treatment of 70° C. or more, a pressurization treatment at 0.1 kPa or more or both of them, the coating film can be formed more densely. A method for the heat treatment is not particularly limited and can be performed by use of e.g., a known apparatus. A method for pressurization treatment is not particularly limited and can be performed by use of e.g., a known apparatus.

<Member of Energy Conversion Apparatus>

The laminate of the embodiment can be preferably used as a member of an energy conversion apparatus. Examples of the energy conversion apparatus include a power generation apparatus using sunlight. The member of an energy conversion apparatus refers to a member that can be used, for example, in power generation using sunlight. More specific examples thereof include a member for use in a solar cell module and a member for use in a solar thermal power generation system. More specifically, the laminate can be used in cover glass, which is a protective member for the surface of a solar cell module, a backsheet, which is a protective member for a rear surface, a sealant, a mold frame such as an aluminum frame, Fresnel lens of a concentrator solar cell and a light reflecting mirror for use in solar thermal power generation.

Particularly, the laminate of the embodiment is preferably used as a protective member for a solar cell module. For example, if a large scale solar cell module is set up in desert and the like and used sand particles and the like blown up by wind attach to the protective member of the solar cell module, producing problems: the surface of the member is scratched, transparency and the effect of antifouling properties decrease. However, in the embodiment, the coating film of the laminate is excellent in antifouling properties, transparency, hydrophilicity and durability (shock resistance) and surface hydrophilicity can be maintained even at high temperature/high humidity, attached sand particles, dust and the like can be easily washed out with e.g., rain water.

<Solar Cell Module>

Figure 2:
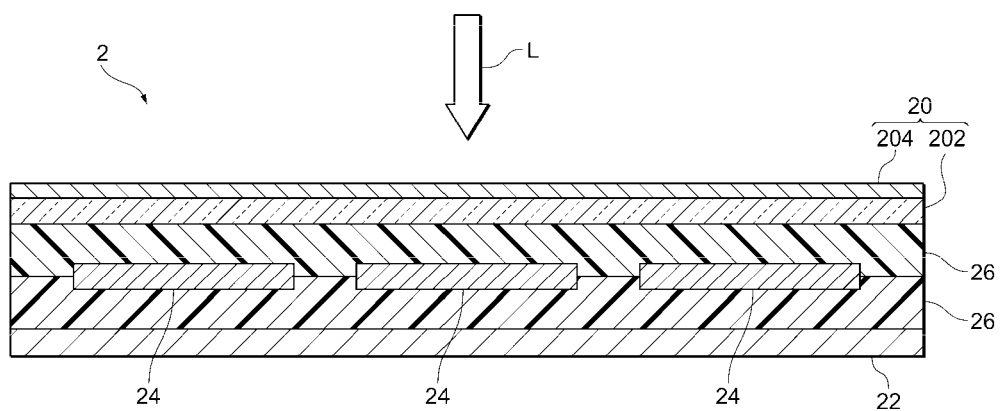
FIG. 2 is a schematic sectional view of a solar cell module according to an embodiment of the present invention.

The laminate of the embodiment is used in a solar cell module as a protective member (hereinafter, sometimes simply referred to as the protective member) of solar cell module. FIG. 2 is a schematic sectional view showing an aspect of a solar cell of the embodiment. In the embodiment, a solar cell module 2 has a protective member 20, a backsheet 22, which is arranged so as to face the protective member 20 and a power generating element 24 arranged between the protective member 20 and the backsheet 22. Furthermore, the power generating element 24 is sealed by a sealant 26. In the solar cell module 2, sunlight L is incident on the protective member 20 and reaches the power generating element 24.

The protective member 20 is used for protecting the power generating element 24 and the like. The protective member 20 has a coating film 204 formed on the surface of the substrate. In this case, the protective member 20 serves as light transmissible substrate through which sunlight transmits and simultaneously can prevent a temperature increase of a solar cell module because the member is excellent in the aforementioned antifouling properties and infrared ray blocking properties. It is thus preferable that the protective member 20 is used such that the surface on which the coating film 204 is formed corresponds to the surface side of the solar cell module 2.

The protective member 20 preferably has performance ensuring long-term reliability of the solar cell module 2, such as weather resistance, water repellency, antifouling properties and mechanical strength even though it is exposed to outdoor air. Furthermore, the member is preferably a highly transparent member while minimizing optical loss in order to efficiently use sunlight. Examples of a substrate 202 are not particularly limited and the aforementioned ones can be used. Specific examples thereof include, a glass substrate; a resin film formed of a poly ester resin, a fluorine resin, an acrylic resin, a cyclic olefin (co) polymer, an ethylene-vinyl acetate copolymer and the like. Of these, in view of weather resistance, shock resistance and cost balance, a glass substrate is more preferable.

In the case where a glass substrate is used, it is preferable that the total light transmittance of light having a wavelength 350 to 1400 nm is 80% or more and more preferably 90% or more. As such glass substrate, a white crown glass plate having a low absorption of an infrared region is generally used. Even in the case of a soda lime glass plate, as long as it has a thickness of 3 mm or less, output characteristic of the solar cell module is usually less affected. Furthermore, if a heat treatment is applied to enhance the mechanical strength of a glass substrate, strengthened glass can be obtained; however, float-plate glass to which no heat treatment is applied may be used.

As the resin film, in view of transparency, strength, cost and the like, a polyester resin is preferable and particularly, a polyethylene terephthalate resin is more preferable. Furthermore, a fluorine resin extremely excellent in weather resistance is preferably used. Specific examples thereof include an ethylene tetrafluoride-ethylene copolymer (ETFE), a polyvinyl fluoride resin (PVF), polyvinylidene fluoride resin (PVDF), a polytetrafluoride ethylene resin (TFE), a tetrafluoride ethylene-hexafluoride propylene copolymer (FEP) and a chlorotrifluoro ethylene resin (CTFE). In view of weather resistance, a polyvinylidene fluoride resin is preferable. In view of maintaining both weather resistance and mechanical strength, an ethylene tetrafluoride-ethylene copolymer is preferable.

As the coating film 204, the aforementioned coating film can be used. As a method for forming the coating film 204 on the substrate 202, the aforementioned method can be used.

The backsheet 22 is not particularly limited; however since it is arranged in the outermost surface layer of a solar cell module, the backsheet preferably has various properties such as weather resistance and mechanical strength similarly to the aforementioned protective member 20. Therefore, the backsheet may be formed of the same material as used in the protective member 20. More specifically, the aforementioned various material that can be used for the protective member 20 (particularly, substrate 202) can be used for the backsheet. Particularly, a polyester resin and a glass substrate can be preferably used. Of them, in view of weather-resistance and cost, a polyethylene terephthalate resin (PET) is more preferable.

The backsheet 22 is designed on the assumption that no sunlight passes therethrough, transparency (light-transmitting properties) is not required although it is required for the protective member 20. Then, a reinforcing sheet (not shown) may be attached in order to increase mechanical strength of the solar cell module 2 and prevent distortion and warpage caused by temperature change. For example, a steel board, a plastic board and an FRP (fiberglass reinforced with plastic) board can be preferably used.

The backsheet 22 may have a multi-layer structure consisting of two or more layers. As an example of the multi-layer structure, a structure in which one or two or more layers consisting of the same components are symmetrically stacked on both sides of a central layer may be mentioned. Examples of such a structure include PET/alumina deposited PET/PET, PVF (trade name: Tedlar)/PET/PVF, and PET/AL foil/PET.

The power generating element 24 is not particularly limited as long as it generates power by use of photovoltaic effect of a semiconductor. Examples thereof that can be used include silicon (single crystalline, polycrystalline, amorphous silicon) and a compound semiconductor (3-5 family, 2-6 family, and so forth). Of these, polycrystalline silicon is preferable in view of balance between power generation performance and cost.

As the sealant 26, any member can be used as long as it can seal the power generating element 24 and the type of sealant is not particularly limited. Examples thereof include a resin sealant sheet containing a resin such as an ethylene-vinyl acetate copolymer (EVA). Such a resin sealant sheet, if it is melted by application of heat, tightly adheres to the power generating element 24 (object to be sealed) and successfully seals it. If such a sealant is used, excellent adhesiveness to the protective member 20 and the backsheet 22 can be exerted while preventing creep of the power generating element.

A method for manufacturing the solar cell of the embodiment is not particularly limited and a known method can be employed. For example, the solar cell can be manufactured by sequentially stacking the protective member 20/sealant 26/power generating element 24/sealant 26/backsheet 22 in this order, and subjecting the stacked layers to a vacuum laminate process performed by a vacuum laminate apparatus under the conditions of 150° C. for 15 minutes.

In the solar cell module 2, the thickness of each member is not particularly limited; however, the thickness of the protective member 20 is preferably 3 mm or more in view of weather-resistance and shock resistance; the thickness of the backsheet 22 is preferably 75 µm or more in view of insulation; the thickness of the power generating element 24 is preferably 140 µm to 250 µm in view of balance between power generation performance and cost; and the thickness of the sealant 26 preferably 250 µm or more in view of cushioning properties and sealing properties.

<Reflector Device>

Figure 3:
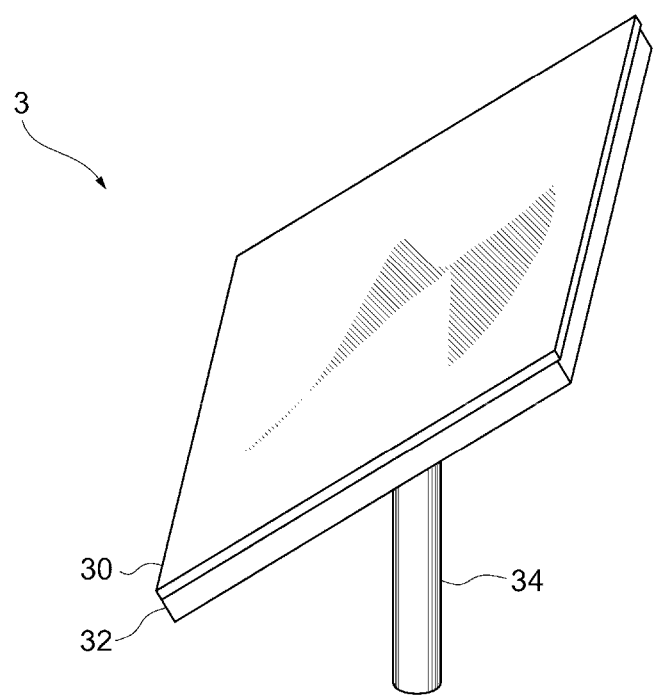
FIG. 3 is a schematic perspective view of a reflector device according to an embodiment of the present invention.

FIG. 3 is a schematic perspective view of a reflector device of the embodiment. A reflector device 3 has a light reflecting mirror 32, a laminate 30 of the embodiment formed on the reflecting surface side of the light reflecting mirror, a support 34 for supporting the reflecting mirror 32. The reflector device employs the laminate 30 of the embodiment as a protective member for the light reflecting mirror 32 (hereinafter, sometimes simply referred to as the "protective member"). The structure of the reflector device 3 is not particularly limited and appropriately modified into a preferable structure.

<Solar Thermal Power Generation System>

In the embodiment, a solar thermal power generation system can be provided, which has the reflector device and a conversion apparatus for converting sunlight collected by the reflector device into electrical energy. The structure of the solar thermal power generation system is not particularly limited and appropriately modified into a preferable structure.

EXAMPLES

The present invention will be more specifically described by way of Examples and Comparative Examples, below. However, the present invention is not limited to the examples below. Note that physical properties were evaluated by the following methods. Note that in the examples, unless otherwise specified, "%" and "parts" are based on mass.

Number Average Particle Size

A number average particle size was measured by diluting a sample by adding a solvent such that the solid content in the sample was 0.1 to 20 mass % and using a wet-process particle-size analyzer (Microtrack UPA-9230 manufactured by Nikkiso Co., Ltd.).

Initial Contact Angle

A deionized water drop was placed on the surface (the coating-composition applied surface) of a sample and allowed to stand still at 23° C. for one minute, and thereafter, an initial contact angle was measured by a contact-angle measuring device (CA-X150 contact angle meter manufactured by Kyowa Interface Science Co., Ltd.).

Initial Haze/Light Transmittance

The haze value (initial haze value) of a sample was measured by use of a turbidimeter (NDH2000 manufactured by Nippon Denshoku Industries Co., Ltd.) in accordance with JIS K7105. Note that light transmittance was measured in accordance with JIS K7105.

Appearance of Coating Film

Appearance of a sample (coating-composition applied surface) was observed by a microscope (manufactured by Keyence Corporation; magnification: 100×). The results were evaluated as follows:

○: Microcracks are rarely observed,
Δ: Many microcracks are observed,
X: Film cannot be formed.

Contact Angle after Heat Resistance Test

After a sample was stored at 70° C. for 10 days, a deionized water drop was placed on the coating surface and allowed to stand still at 23° C. for one minute, a contact angle was measured by a contact-angle measuring device (CA-X150 contact angle meter manufactured by Kyowa Interface Science Co., Ltd.).

Contact Angle after High Humidity Test

After a sample was stored for 16 hours in SH-661 (manufactured by ESPEC Corp.) set to 40° C. and 90% RH, a deionized water drop was placed on the coating surface and allowed to stand still at 23° C. for one minute, and then a contact angle was measured by a contact-angle measuring device (CA-X150 contact angle meter manufactured by Kyowa Interface Science Co., Ltd.).

Contact Angle after High-Temperature/High-Humidity Storage

After a sample was allowed to stand still for 24 hours in SH-661 (manufactured by ESPEC Corp.) set to 90° C. and 90% RH, a deionized water drop was placed on the coating surface and allowed to stand still at 23° C. for one minute, and then a contact angle was measured by a contact-angle measuring device (CA-X150 contact angle meter manufactured by Kyowa Interface Science Co., Ltd.).

Pencil Hardness

The pencil hardness of a sample was measured by a pencil hardness meter (manufactured by Tester Sangyo Co., Ltd.).

Abrasion Resistance Test

The surface of a sample was rubbed reciprocally 10 times by a cotton swab with an application of a load of 500 g, and then a change was visually observed.
○: Substantially no change
Δ: Slightly scratched
X: Many scratches Coating Film Reflectivity The absolute reflectivity of a sample was measured by a reflection spectroscopy film-thickness meter (FE3000 manufactured by Otsuka Electronics Co., Ltd.).

Antistatic Properties

The surface resistance value of a surface was measured by a turbidimeter (NDH2000 manufactured by Nippon Denshoku Industries Co., Ltd.).

Appearance after Solvent Resistance Test

After a solvent-resistant composite was prepared, the coating composition-applied surface of the solvent-resistant composite was rubbed reciprocally 10 times by a cotton swab previously soaked in isopropyl alcohol with an application of a load of 500 g. The state of a coating film was observed by a microscope (manufactured by Keyence Corporation; magnification: 100×). The results were evaluated as follows:
○: Microcracks are rarely observed,
Δ: Microcracks are observed,
X: Many cracks appear.

Heat Resistance

A heat-resistant composite was formed and thereafter pressed against a hot plate of 150° C. for 10 minutes. Then, a haze value was measured by a turbidimeter (NDH2000 manufactured by Nippon Denshoku Industries Co., Ltd.). The results were evaluated as follows:
○: Haze≤2,
Δ: 2<haze≤10,
X: 10<haze.

Solvent Resistance

A functional composite (coating film used in a Comparative Example) was prepared. The surface thereof was rubbed reciprocally 10 times by a cotton swab impregnated with acetone and then appearance of the surface was visually observed.
◉: Rarely changed,
○: Slightly changed,
Δ: Somewhat bleached,
X: Significantly bleached.

Surface Hardness

The pencil hardness of a sample (coating film used in a Comparative Example) was measured by a pencil hardness meter (manufactured by Tester Sangyo Co., Ltd.).

Laminate Reflectivity

Using an UV-Vis/NIR Spectrophotometer (trade name "V-670" manufactured by JASCO Corporation) and a large-scale integrating sphere meter, the reflectivity values of a substrate and a laminate were measured. The measurement was performed within the range of a wavelength of 350 nm to 500 nm and the highest reflectivity value was employed as an evaluation value. In measuring the reflectivity of the laminate, as a substrate, a mirror formed by depositing Al onto a 3 mm-thick soda lime glass was used. The soda lime glass plate surface is coated with a coating composition and reflectivity of light incident upon the coating-film surface was used as a measurement value.

Film Thickness and Refractive Index

Using a film-thickness meter (trade name "FE-3000" manufactured by Otsuka Electronics Co., Ltd.), the film thickness of a coating-film laminate and the refractive indexes (wavelength: 633 nm) of the coating film and the substrate were measured.

Contact Angle after Weather-Resistance Test

The coating films stacked on a substrate was subjected to a weather-resistance test by a xenon weather meter (manufactured by Suga Test Instruments Co., Ltd., cycle conditions: xenon lamp luminous intensity: 60 W/m$^2$, BPT 63° C., 50% RH, 102 minutes, rainfall, 30° C., 95% RH, 18 minutes) for 2500 hours. Subsequently, a deionized water drop was placed on the coating-film surface, and allowed to stand still at 23° C. for one minute, and then the contact angle of the water drop was measured by a contact-angle measuring device (CA-X150 contact-angle meter manufactured by Kyowa Interface Science Co., Ltd.).

Pore Size, Porosity

The coating-film surface was observed by use of an electron microscope at a magnification of 250,000× to obtain the maximum diameter and width of pores in the surface. Furthermore, a circumscribed circle equivalent diameter was obtained. The volume of a coating film was obtained based on the area of a 1000 nm-squares and a film thickness. Based on the results, porosity was calculated.

Analysis of Carbon Amount (C/Si) of Coating-Film Surface

The coating film formed on a substrate was made into pieces of about 3 mm-squares, which were used as measurement samples. Measurement was performed by use of XPS (PHI Quantera SXM) in the conditions: an excitation source: monoAlkα, 15 kV×6.7 mA, analysis size: 1.5 mm×100 μm, intake region (survey scan; 0 to 1, 100 eV, Narrow scan; Si, 2p, C1s (K, 2p), O1s, Na1s, Ca2p, Pass-Energy (survey scan; 200 eV, Narrow scan; 112 eV). The results were obtained by normalizing the relative concentrations (atomic %) of individual elements based on Si element as 1 to computationally obtain a C/Si ratio.

Production Example 1

Synthesis of Water Dispersion of Polymer Emulsion Particle (HB-1)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (150 g), tetraethoxysilane (30 g), phenyltrimethoxysilane (145 g) and 3-methacryloxypropyltrimethoxysilane (1.3 g) and a solution mixture of diethylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-1) having a number average particle size of 70 nm. The content of an aqueous-phase component was 18 mass %.

Production Example 2

Synthesis of Water Dispersion of Polymer Emulsion Particle (HB-2)

To a reaction vessel having a reflux condenser, a dropping tank, a thermometer and a stirrer, ion-exchanged water (1600 g) and dodecyl benzene sulfonic acid (4.6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (86 g), phenyltrimethoxysilane (133 g) and 3-methacryloxypropyltrimethoxysilane (1.3 g) and a solution mixture of diethylacrylamide (137 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-2) having a number average particle size of 100 nm. The content of an aqueous-phase component was 18 mass %.

Production Example 3

Synthesis of Water Dispersion of Polymer Emulsion Particle (HB-3)

To a reaction vessel having a reflux condenser, a dropping tank, a thermometer and a stirrer, ion-exchanged water (1600 g) and dodecyl benzene sulfonic acid (2.6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (86 g), phenyltrimethoxysilane (133 g) and 3-methacryloxypropyltrimethoxysilane (1.3 g) and a solution mixture of diethylacrylamide (137 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-3) having a number average particle size of 180 nm. The content of an aqueous-phase component was 18 mass %.

Production Example 4

Synthesis of Water Dispersion of Polymer Emulsion Particle (HB-4)

To a reaction vessel having a reflux condenser, a dropping tank, a thermometer and a stirrer, ion-exchanged water (1600 g) and dodecyl benzene sulfonic acid (4 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (86 g), phenyltrimethoxysilane (133 g) and 3-methacryloxypropyltrimethoxysilane (1.3 g) and a solution mixture of diethylacrylamide (137 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-4) having a number average particle size of 130 nm. The content of an aqueous-phase component was 18 mass %.

Production Example 5

Synthesis of Water Dispersion of Polymer Emulsion Particle (HB-5)

To a reaction vessel having a reflux condenser, a dropping tank, a thermometer and a stirrer, ion-exchanged water (1600 g) and dodecyl benzene sulfonic acid (10 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (86 g), phenyltrimethoxysilane (133 g) and 3-methacryloxypropyltrimethoxysilane (1.3 g) and a solution mixture of diethylacrylamide (137 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-5) having a number average particle size of 40 nm. The content of an aqueous-phase component was 18 mass %.

Production Example 6

Synthesis of Water Dispersion of Polymer Emulsion Particle (HB-6)

To a reaction vessel having a reflux condenser, a dropping tank, a thermometer and a stirrer, ion-exchanged water (1600 g) and dodecyl benzene sulfonic acid (20 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (86 g), phenyltrimethoxysilane (133 g) and 3-methacryloxypropyltrimethoxysilane (1.3 g) and a solution mixture of diethylacrylamide (137 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-6) having a number average particle size of 20 nm. The content of an aqueous-phase component was 18 mass %.

Production Example 7

Synthesis of Water Dispersion of Polymer Emulsion Particle (HB-7)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (150 g), tetraethoxysilane (30 g), phenyltrimethoxysilane (145 g) and 3-methacryloxypropyltrimethoxysilane (1.3 g) and a solution mixture of N-isopropylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-7) having a number average particle size of 70 nm. The content of an aqueous-phase component was 18 mass %.

Production Example 8

Synthesis of Water Dispersion of Polymer Emulsion Particle (HB-8)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of butyl acrylate (150 g), tetraethoxysilane (30 g), phenyltrimethoxysilane (145 g) and 3-methacryloxypropyltrimethoxysilane (1.3 g) and a solution mixture of diethylacrylamide (150 g), (meth)acrylic acid ethylene glycol (15 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, stirring was continued for about two hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-8) having a number average particle size of 70 nm. The content of an aqueous-phase component was 18 mass %.

Production Example 9

Synthesis of Water Dispersion of Polymer Emulsion Particle (HB-9)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of methyl methacrylate (150 g), tetraethoxysilane (30 g), phenyltrimethoxysilane (145 g) and 3-methacryloxypropyltrimethoxysilane (1.3 g) and a solution mixture of diethylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, heat curing was continuously performed for about eight hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-9) having a number average particle size of 90 nm. The content of an aqueous-phase component was 5 mass %.

Production Example 10

Synthesis of Water Dispersion of Polymer Emulsion Particle (HB-10)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of cyclohexyl methacrylate (75 g), methyl methacrylate (75 g), tetraethoxysilane (30 g), phenyltrimethoxysilane (145 g) and 3-methacryloxypropyltrimethoxysilane (1.3 g) and a solution mixture of diethylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, heat curing was continuously performed for about eight hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-10) having a number average particle size of 70 nm. The content of an aqueous-phase component was 5 mass %.

Production Example 11

Synthesis of Water Dispersion of Polymer Emulsion Particle (HB-11)

To a reaction vessel having a reflux condenser, a dropping tank, a thermometer and a stirrer, ion-exchanged water (1600 g) and dodecyl benzene sulfonic acid (6 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the temperature of the reaction vessel at 80° C. Subsequently, a solution mixture of cyclohexyl methacrylate (75 g), methyl methacrylate (75 g), tetraethoxysilane (30 g), phenyltrimethoxysilane (145 g) and 3-methacryloxypropyltrimethoxysilane (1.3 g) and a solution mixture of diethylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, heat curing was continuously performed for about four hours while keeping the temperature of the reaction vessel at 80° C. Thereafter, the temperature of the reaction vessel was cooled to room temperature and filtration was performed by a 100 mesh wire netting. The solid content concentration was controlled to be 10.0 mass % with ion-exchanged water to obtain a water dispersion of the polymer emulsion particle (HB-11) having a number average particle size of 70 nm. The content of an aqueous-phase component was 9 mass %.

Examples 1 to 35; Tables 1 to 4

"SNOWTEX" (component (A)) (trade name, manufactured by Nissan Chemical Industries, Ltd.) dispersed in water (solid content: 10 mass %), a polymer emulsion particle (HB) obtained in each of Production Examples and tetraethoxysilane (C) were blended in accordance with the formulations shown in Table 1. In this manner, coating compositions were obtained. The particle sizes of "SNOWTEX" shown in the table were those listed in a catalog.

The obtained coating composition was applied onto a glass plate (5 cm×5 cm) by dip coating, dried at 70° C. for 10 minutes to obtain a laminate having a coating film. The evaluation results of these are shown in Tables 1 to 4.

TABLE 1

| (parts by mass) | | | | Examples | | | | | | |
|---|---|---|---|---|---|---|---|---|---|---|
| | | | | 1 | 2 | 3 | 4 | 5 | 6 | 7 |
| Emulsion particles | HB-1 | Particle size | 70 nm | | | | | | | |
| | HB-2 | | 100 nm | | | | | | | |
| | HB-4 | | 130 nm | | | | | | | |
| | HB-3 | | 180 nm | | | | | | | |

TABLE 1-continued

|  |  |  |  |  |  |  |  |  |  |  |
|---|---|---|---|---|---|---|---|---|---|---|
|  | HB-5 |  | 40 nm |  |  |  |  |  |  |  |
|  | HB-6 |  | 20 nm |  |  |  |  |  |  |  |
|  | HB-7 |  | 70 nm |  |  |  |  |  |  |  |
|  | HB-8 |  | 70 nm |  |  |  |  |  |  |  |
|  | HB-9 |  | 90 nm |  |  |  |  |  |  |  |
|  | HB-10 |  | 70 nm | 100 | 100 | 100 | 100 | 100 | 100 | 100 |
|  | HB-11 |  | 70 nm |  |  |  |  |  |  |  |
|  | Content of aqueous-phase component (%) |  | — | 5 | 5 | 5 | 5 | 5 | 5 | 5 |
|  | Colloidal silica A (STOS) |  | 8 nm | 200 | 300 | 200 | 200 | 250 | 350 | 200 |
|  | Colloidal silica A (STO) |  | 10 nm |  |  |  |  |  |  |  |
|  | Tetraethoxysilane C (relative to 100 g of component A) |  |  | 107 |  |  |  |  |  |  |
|  | MS56C (relative to 100 g of component A) |  |  |  | 120 | 80 | 160 | 120 | 120 | 10 |
| Physical properties of coating film | Optical properties | Haze value |  | 0.3 | 0.2 | 0.3 | 0.3 | 0.3 | 0.2 | 0.3 |
|  |  | Total light transmittance |  | 93.3 | 93.2 | 93.3 | 93.5 | 93.4 | 93.1 | 93.5 |
|  |  | Refractive index |  | 1.42 | 1.43 | 1.42 | 1.44 | 1.43 | 1.41 | 1.44 |
|  |  | Reflectivity |  | 85.2 | 85.7 | 84.3 | 84.7 | 85 | 85.2 | 85.1 |
|  |  | Film thickness (nm) |  | 500 | 500 | 500 | 500 | 500 | 500 | 500 |
|  | Hydrophilicity (contact angle) | Initial |  | 6 | 5 | 4 | 4 | 4 | 6 | 7 |
|  |  | After high-temperature/high-humidity test |  | 11 | 13 | 15 | 13 | 11 | 12 | 13 |
|  |  | After high-humidity test |  | 8 | 6 | 5 | 4 | 6 | 8 | 9 |
|  |  | Heat resistance test |  | — | — | — | — | — | — | — |
|  | Surface composition | C/Si |  | — | — | — | — | — | 0.39 | — |

|  |  |  |  | Examples |  |  |  |  |  |
|---|---|---|---|---|---|---|---|---|---|
| (parts by mass) |  |  |  | 8 | 9 | 10 | 11 | 12 | 13 |
| Emulsion particles | HB-1 | Particle size | 70 nm |  |  |  |  |  |  |
|  | HB-2 |  | 100 nm |  |  |  |  |  |  |
|  | HB-4 |  | 130 nm |  |  |  |  |  |  |
|  | HB-3 |  | 180 nm |  |  |  |  |  |  |
|  | HB-5 |  | 40 nm |  |  |  |  |  |  |
|  | HB-6 |  | 20 nm |  |  |  |  |  |  |
|  | HB-7 |  | 70 nm |  |  |  |  |  |  |
|  | HB-8 |  | 70 nm |  |  |  |  |  |  |
|  | HB-9 |  | 90 nm |  | 100 |  |  | 100 | 100 |
|  | HB-10 |  | 70 nm | 100 |  | 100 | 100 |  |  |
|  | HB-11 |  | 70 nm |  |  |  |  |  |  |
|  | Content of aqueous-phase component (%) |  | — | 5 | 5 | 5 | 5 | 5 | 5 |
|  | Colloidal silica A (STOS) |  | 8 nm | 200 | 200 | 200 | 300 | 400 | 400 |
|  | Colloidal silica A (STO) |  | 10 nm |  |  |  |  |  |  |
|  | Tetraethoxysilane C (relative to 100 g of component A) |  |  |  |  | 107 | 250 | 107 | 161 |
|  | MS56C (relative to 100 g of component A) |  |  | 27 | 54 |  |  |  |  |
| Physical properties of coating film | Optical properties | Haze value |  | 0.3 | 0.76 | 0.4 | 0.4 | 0.4 | 0.3 |
|  |  | Total light transmittance |  | 93.4 | 93.6 | — | — | 93.7 | 93.8 |
|  |  | Refractive index |  | 1.43 | 1.44 | 1.41 | 1.46 | — | — |
|  |  | Reflectivity |  | 84.9 | — | — | — | — | — |
|  |  | Film thickness (nm) |  | 500 | 1000 | — | — | 500 | 200 |

TABLE 1-continued

|  |  |  |  |  |  |  |  |  |
|---|---|---|---|---|---|---|---|---|
| Hydrophilicity (contact angle) | Initial | 8 | 5 | 5 | 5 | 5 | 5 |  |
|  | After high-temperature/high-humidity test | 10 | 8 | 10 | 12 | — | — |  |
|  | After high-humidity test | 8 | 6 | 6 | 7 | 6 | 6 |  |
|  | Heat resistance test | — | — | — | — | 25 | 29 |  |
| Surface composition | C/Si | — | — | — | — | — | — |  |

TABLE 2

| (parts by mass) | | | | Examples |  |  |  |  |  |  |  |
|---|---|---|---|---|---|---|---|---|---|---|---|
|  |  |  |  | 14 | 15 | 16 | 17 | 18 | 19 | 20 | 21 |
| Emulsion particles | HB-1 | Particle size | 70 nm |  | 100 | 100 | 100 | 100 | 100 | 100 | 100 |
|  | HB-2 |  | 100 nm |  |  |  |  |  |  |  |  |
|  | HB-4 |  | 130 nm |  |  |  |  |  |  |  |  |
|  | HB-3 |  | 180 nm |  |  |  |  |  |  |  |  |
|  | HB-5 |  | 40 nm |  |  |  |  |  |  |  |  |
|  | HB-6 |  | 20 nm |  |  |  |  |  |  |  |  |
|  | HB-7 |  | 70 nm |  |  |  |  |  |  |  |  |
|  | HB-8 |  | 70 nm |  |  |  |  |  |  |  |  |
|  | HB-9 |  | 90 nm | 100 |  |  |  |  |  |  |  |
|  | HB-10 |  | 70 nm |  |  |  |  |  |  |  |  |
|  | HB-11 |  | 70 nm |  |  |  |  |  |  |  |  |
|  | Content of aqueous-phase component (%) |  | — | 5 | 18 | 18 | 18 | 18 | 18 | 18 | 18 |
| Colloidal silica A (STOS) | Particle size | 8 nm | 200 |  |  |  |  |  |  |  |  |
| Colloidal silica A (STO) |  | 10 nm |  | 120 | 115 | 120 | 250 | 300 | 350 | 300 |  |
| Tetraethoxysilane C (relative to 100 g of component A) |  |  | 107 | 8.9 | 18 | 107 | 107 | 0.5 | 107 | 250 |  |
| MS56 C (relative to 100 g of component A) |  |  |  |  |  |  |  |  |  |  |  |
| Physical properties of coating film | Optical properties | Haze value | 0.78 | 0.5 | 0.5 | 0.4 | 0.4 | 0.5 | 0.4 | 0.4 |  |
|  |  | Total light transmittance | 93.7 | 93.1 | 93.2 | 93.5 | 93.5 | 93.4 | 93.5 | 93.2 |  |
|  |  | Refractive index | 1.43 | — | — | — | — | — | — | — |  |
|  |  | Reflectivity | — | — | — | — | — | — | — | — |  |
|  |  | Film thickness (nm) | 1000 | 500 | 500 | 500 | 500 | 500 | 500 | 500 |  |
|  | Hydrophilicity (contact angle) | Initial | 5 | 7 | 10 | 8 | 11 | 6 | 11 | 12 |  |
|  |  | After high-temperature/high-humidity test | 9 | — | — | — | — | — | — | — |  |
|  |  | After high-humidity test |  |  |  |  |  |  |  | 11 |  |
|  |  | Heat resistance test | — | 7 | 19 | 9 | 12 | 23 | 18 | 25 |  |
|  | Surface composition | C/Si | 0.45 | — | — | — | — | — | — | — |  |

| (parts by mass) | | | | Examples |  |  |  |  |  |  |
|---|---|---|---|---|---|---|---|---|---|---|
|  |  |  |  | 22 | 23 | 24 | 25 | 26 | 27 | 28 |
| Emulsion particles | HB-1 | Particle size | 70 nm |  |  |  |  |  |  |  |
|  | HB-2 |  | 100 nm |  |  |  |  |  |  |  |
|  | HB-4 |  | 130 nm |  |  |  |  |  |  |  |
|  | HB-3 |  | 180 nm |  |  |  |  |  |  |  |
|  | HB-5 |  | 40 nm | 100 |  |  |  |  |  |  |
|  | HB-6 |  | 20 nm |  | 100 |  |  |  |  |  |
|  | HB-7 |  | 70 nm |  |  | 100 | 100 | 100 |  |  |
|  | HB-8 |  | 70 nm |  |  |  |  |  |  | 100 |
|  | HB-9 |  | 90 nm |  |  |  |  |  |  |  |

TABLE 2-continued

| | | | | | | | | | |
|---|---|---|---|---|---|---|---|---|---|
| | HB-10 | | 70 nm | | | | | | |
| | HB-11 | | 70 nm | 100 | | | | | |
| | Content of aqueous-phase component (%) | | — | 9 | 18 | 18 | 18 | 18 | 18 | 18 |
| Colloidal silica A (STOS) | Particle size | 8 nm | 200 | | | | | | |
| Colloidal silica A (STO) | | 10 nm | | | 200 | 200 | 200 | 100 | 200 | 200 |
| Tetraethoxysilane C (relative to 100 g of component A) | | | | | 107 | 107 | 107 | 10 | 50 | 107 |
| MS56 C (relative to 100 g of component A) | | | | 54 | | | | | | |
| Physical properties of coating film | Optical properties | Haze value | 0.3 | 0.3 | 0.2 | 0.4 | 0.5 | 0.4 | 0.4 |
| | | Total light transmittance | 93.6 | 93.1 | 92.9 | 93.4 | 93.6 | 93.5 | 93.5 |
| | | Refractive index | 1.43 | 1.44 | 1.45 | 1.41 | 1.39 | 1.4 | 1.4 |
| | | Reflectivity | — | — | — | — | — | — | — |
| | | Film thickness (nm) | 500 | 500 | 500 | 500 | 500 | 500 | 500 |
| | Hydrophilicity (contact angle) | Initial | 7 | 12 | 15 | 8 | 13 | 10 | 9 |
| | | After high-temperature/high-humidity test | 15 | — | — | — | — | — | — |
| | | After high-humidity test | 9 | 15 | 18 | 14 | 17 | 13 | 12 |
| | | Heat resistance test | 8 | 20 | 23 | 17 | 20 | 19 | 19 |
| | Surface composition | C/Si | 0.47 | — | — | — | — | — | — |

TABLE 3

| | (parts by mass) | | Example 29 | Example 30 | Example 31 | Example 32 |
|---|---|---|---|---|---|---|
| Emulsion particles | HB-1 | 70 nm | | | 100 | |
| | HB-2 | 100 nm | 100 | | | 100 |
| | HB-4 | 130 nm | | 100 | | |
| | HB-3 | 180 nm | | | | |
| | HB-5 | 40 nm | | | | |
| | HB-6 | 20 nm | | | | |
| | HB-7 | 70 nm | | | | |
| | HB-8 | 70 nm | | | | |
| | HB-9 | 90 nm | | | | |
| | HB-10 | 70 nm | | | | |
| | HB-11 | 70 nm | | | | |
| Content of aqueous-phase component (%) | | — | 18 | 18 | 18 | 18 |
| Colloidal silica A (STOS) | Particle size | 8 nm | 100 | 100 | | |
| Colloidal silica A (STO) | Particle size | 10 nm | | | 100 | 100 |
| Tetraethoxysilane C (relative to 100 g of component A) | | | 69 | 0 | 8.9 | 0.8 |
| MS56C (relative to 100 g of component A) | | | | | | |
| Physical properties of coating film | Optical properties | Haze value | 1 | 1.5 | 0.5 | 1.1 |
| | | Total light transmittance | 93.5 | 93.6 | 93.5 | 93.5 |
| | | Refractive index | 1.4 | 1.38 | — | — |
| | | Reflectivity | — | — | — | — |
| | | Film thickness (nm) | 500 | 500 | 500 | 500 |
| | | Appearance | ◯ | ◯ | ◯ | ◯ |
| | Hydrophilicity (contact angle) | Initial | 12 | 15 | 13 | 12 |
| | | After high-temperature/high-humidity test | 55 | 75 | — | — |
| | | After high-humidity test | 42 | 45 | 38 | 39 |
| | | Heat resistance test | 38 | 40 | 38 | 40 |
| | Surface composition | C/Si | 0.68 | 0.72 | 0.58 | — |

TABLE 4

| (parts by mass) | | | Example 33 | Example 34 | Example 35 |
|---|---|---|---|---|---|
| Emulsion particles | HB-1 | 70 nm | 100 | | |
| | HB-2 | 100 nm | | | |
| | HB-4 | 130 nm | | 100 | |
| | HB-3 | 180 nm | | | 100 |
| | HB-5 | 40 nm | | | |
| | HB-6 | 20 nm | | | |
| | HB-7 | 70 nm | | | |
| | HB-8 | 70 nm | | | |
| | HB-9 | 90 nm | | | |
| | HB-10 | 70 nm | | | |
| | HB-11 | 70 nm | | | |
| | Content of aqueous-phase component (%) | — | 18 | 18 | 18 |
| | Colloidal silica A (STOS) | 8 nm | | | |
| | Colloidal silica A (STO) | 10 nm | 500 | 100 | 100 |
| | Tetraethoxysilane C (relative to 100 g of component A) | | 143 | 8.9 | 8.9 |
| | MS56C (relative to 100 g of component A) | | | | |
| | Titanium oxide (A2) | | | | |
| Physical properties of coating film | Optical properties | Haze value | 2 | 1.2 | 1.5 |
| | | Total light transmittance | 92.5 | 92.6 | 92.6 |
| | | Refractive index | — | — | — |
| | | Reflectivity | — | — | — |
| | | Film thickness (nm) | 200 | 500 | 500 |
| | | Appearance | ○ | ○ | ○ |
| | Hydrophilicity (contact angle) | Initial | 10 | 12 | 11 |
| | | After high-temperature/high-humidity test | — | — | — |
| | | After high-humidity test | 35 | 37 | 37 |
| | | Heat resistance test | 34 | 36 | 38 |
| | Surface composition | C/Si | — | — | — |

As is apparent from Tables 1 to 4, it was demonstrated that the laminates of Examples are excellent at least in transparency and hydrophilicity and maintain surface hydrophilicity even at high temperature and the like.

Study on Antistatic Use; Table 5

"SNOWTEX O" (component (A)) (trade name, manufactured by Nissan Chemical Industries, Ltd.) dispersed in water (solid content: 10 mass %, a number average particle size: 10 nm), a polymer emulsion particle (HB) obtained in each of Production Examples and tetraethoxysilane (C) were blended as shown in Table 5 to obtain an antistatic coating composition. Subsequently, the obtained coating composition was applied onto a glass plate (5 cm×5 cm) by dip coating and then dried at 70° C. for 10 minutes to obtain an antistatic composite. The evaluation results of these are shown in Table 5.

TABLE 5

| (parts by mass) | | | Examples | | Comparative Example |
|---|---|---|---|---|---|
| | | | 36 | 37 | 1 |
| Substrate | | | PC | PC | PC |
| HB-1 | Particle size | 70 nm | 100 | — | — |
| HB-2 | Particle size | 100 nm | — | 100 | — |
| Content of aqueous-phase component | (%) | | 18 | 18 | — |
| Colloidal silica A | Particle size | 10 nm | 200 | 100 | — |
| Tetraethoxysilane C (relative to 100 g of component A) | | | 107 | 8.9 | — |
| Antistatic composite | Physical properties | Initial contact angle | 7 | 12 | 78 |
| | | Initial haze value | 0.4 | 1.1 | 0.4 |
| | | Appearance | ○ | ○ | ○ |
| | | Surface resistance value (Ω) | $10^{11}$ | $10^{13}$ | $10^{15}$ |

PC: Polycarbonate resin

As shown in Table 5, it was demonstrated that the composites of Examples are excellent at least in hydrophilicity, transparency, appearance and surface resistance value.

Study on Antireflection Use; Table 6

"SNOWTEX O" (component (A)) (trade name, manufactured by Nissan Chemical Industries, Ltd.) dispersed in water (solid content: 10 mass %, a number average particle size: 10 nm), a polymer emulsion particle (HB) obtained in each of Production Examples and tetraethoxysilane (C) were blended as shown in Table 6 to obtain an antireflection coating composition. Subsequently, the obtained coating composition was applied onto a glass plate (5 cm×5 cm) by dip coating and then dried at 70° C. for 10 minutes to obtain an antireflection composite. The evaluation results of these are shown in Table 6.

TABLE 6

|  | (parts by mass) |  | Examples 38 | 39 | 40 | 41 | 42 |
|---|---|---|---|---|---|---|---|
|  | Substrate |  | Glass | Glass | Glass | Glass | Glass |
| HB-1 | Particle size | 130 nm | 100 | — | — | — | — |
| HB-2 | Particle size | 100 nm | — | — | — | 100 | 100 |
| HB-3 | Particle size | 180 nm | — | 100 | 100 | — | — |
| Content of aqueous-phase component | (%) |  | 18 | 18 | 18 | 18 | 18 |
| Colloidal silica A | Particle size | 10 nm | 100 | 200 | 300 | 20 | 200 |
|  | Tetraethoxysilane C |  | 8.9 | 8.9 | 107 | 0 | 69 |
|  | (relative to 100 g of component A) |  |  |  |  |  |  |
| Antireflection composite | Initial physical properties | Initial contact angle | 8 | 8 | 11 | 28 | 12 |
|  |  | Initial haze value | 1.1 | 1.8 | 1.6 | 1.8 | 1.1 |
|  |  | Appearance | ○ | ○ | ○ | ○ | ○ |
|  |  | Reflectivity | 2.80% | 3.2% | 3.30% | 4.10% | 4.80% |

As shown in Table 6, it was demonstrated that the composites of Examples are excellent at least in hydrophilicity, transparency, appearance and reflectivity.

Study on Hard Coating Use; Table 7

"SNOWTEX O" (component (A)) (trade name, manufactured by Nissan Chemical Industries, Ltd.) dispersed in water (solid content: 10 mass %, a number average particle size: 10 nm), a polymer emulsion particle (HB) obtained in each of Production Examples and tetraethoxysilane (C) were blended as shown in Table 7 to obtain a coating composition for hard coating. Subsequently, the obtained coating composition was applied onto a polycarbonate (PC) plate (5 cm×5 cm) of 3 mm in thickness by dip coating and then dried at 70° C. for 10 minutes to obtain a hard coating composite. The evaluation results of these are shown in Table 7.

As shown in Table 7, it was demonstrated that the composites of Examples are excellent at least in hydrophilicity, transparency, appearance and pencil hardness. Furthermore, it was demonstrated that composites of Examples 43 to 45 have abrasion resistance as excellent as practical level.

Study on Solvent Resistant Use; Table 8

"SNOWTEX O" (component (A)) (trade name, manufactured by Nissan Chemical Industries, Ltd.) dispersed in water (solid content: 10 mass %, a number average particle size: 10 nm), a polymer emulsion particle (HB) obtained in each of Production Examples and tetraethoxysilane (C) were blended as shown in Table 8 to obtain a solvent resistant coating composition. Subsequently, the obtained coating composition was applied onto a polycarbonate plate (5 cm×5 cm) by dip coating and then dried at 70° C. for 10 minutes to obtain a solvent resistant composite. The evaluation results of these are shown in Table 8.

TABLE 7

|  | (parts by mass) |  | Examples 43 | 44 | 45 | 46 | Comparative Example 2 |
|---|---|---|---|---|---|---|---|
|  | Substrate |  | PC | PC | PC | PC | PC |
| HB-1 | Particle size | 70 nm | 100 | 100 | — | — | — |
| HB-2 | Particle size | 100 nm | — | — | 100 | — | — |
| HB-3 | Particle size | 180 nm | — | — | — | 100 | — |
| Content of aqueous-phase component | (%) |  | 18 | — | — | — | — |
| Colloidal silica A | Particle size | 10 nm | 150 | 300 | 20 | 380 | — |
|  | Tetraethoxysilane C |  | 8.9 | 8.9 | 0 | 0 | — |
|  | (relative to 100 g of component A) |  |  |  |  |  |  |
| Hard coating composite | Initial physical properties | Initial contact angle | 8 | 8 | 28 | 10 | 78 |
|  |  | Initial haze value | 0.4 | 0.5 | 1.1 | 1.5 | 0.4 |
|  |  | Appearance | ○ | ○ | ○ | ○ | ○ |
|  |  | Abrasion resistance | ○ | ○ | Δ | X | X |
|  |  | Pencil hardness | 3H | 2H | H | F | F |

PC: Polycarbonate resin

TABLE 8

|  |  |  | Examples | | | Comparative Example |
|---|---|---|---|---|---|---|
| (parts by mass) | | | 47 | 48 | 49 | 3 |
| Substrate | | | PC | PC | PC | PC |
| HB-1 | Particle size | 70 nm | 100 | — | 100 | — |
| HB-2 | Particle size | 100 nm | — | 100 | — | — |
| Content of aqueous-phase component | (%) | | 18 | — | — | — |
| Colloidal silica A | Particle size | 10 nm | 120 | 20 | 500 | — |
| | Tetraethoxysilane C (relative to 100 g of component A) | | 8.9 | 0 | 8.9 | — |
| Solvent resistant composite | Physical properties | Initial contact angle | 7 | 28 | 10 | 78 |
| | | Initial haze value | 0.5 | 1.1 | 0.8 | 0.4 |
| | | Appearance | ○ | ○ | X | — |
| | | Appearance after solvent resistance test | ○ | Δ | — | X |

As shown in Table 8, it was demonstrated that the composites of Examples are excellent at least in hydrophilicity and transparency. Furthermore, it was demonstrated that the composites of Examples 47 and 48 have appearance (after the solvent resistance test) as excellent as practical level.

Study on Heat Resistant Use; Table 9

"SNOWTEX O" (component (A)) (trade name, manufactured by Nissan Chemical Industries, Ltd.) dispersed in water (solid content: 10 mass %, a number average particle size: 10 nm), a polymer emulsion particle (HB) obtained in each of Production Examples and tetraethoxysilane (C) were blended as shown in Table 9 to obtain a heat resistant coating composition. Subsequently, the obtained coating composition was applied onto a glass plate (5 cm×5 cm) by dip coating and then dried at 70° C. for 10 minutes to obtain a heat resistant composite. The evaluation results of these are shown in Table 9.

As shown in Table 9, it was demonstrated that the composites of Examples are excellent at least in hydrophilicity, transparency, appearance after heat resistance test and transparency after heat resistance test. In particular, it was demonstrated that the composites of Examples 50 and 51 have more excellent appearance after the heat resistance test.

Study on Functional Composite; Table 10

Example 54

Colloidal silica (trade name "SNOWTEX O" (A), manufactured by Nissan Chemical Industries, Ltd., dispersed in water, solid content: 10 mass %, a number average particle size: 10 nm), polymer emulsion particles (HB-1) and (HB-2) obtained in each of Production Examples and tetraethoxysilane (C) were blended at a ratio shown in Table 10 to obtain a coating composition.

The obtained coating composition was applied onto a substrate (5 cm×5 cm) formed of polycarbonate resin and having a thickness of 3 mm by dip coating and then dried at 70° C. for 10 minutes to obtain a coating film. Furthermore, a heat treatment and a pressurization treatment were applied to the coating film by use of LM50 vacuum laminate

TABLE 9

|  |  |  | Examples | | | | Comparative Example |
|---|---|---|---|---|---|---|---|
| (parts by mass) | | | 50 | 51 | 52 | 53 | 4 |
| Substrate | | | PC | PC | PC | PC | PC |
| HB-1 | Particle size | 70 nm | 100 | 100 | — | — | — |
| HB-2 | Particle size | 100 nm | — | — | 100 | 100 | — |
| Content of aqueous-phase component | (%) | | 18 | 18 | 18 | 18 | — |
| Colloidal silica A | Particle size | 10 nm | 150 | 300 | 20 | 300 | — |
| | Tetraethoxysilane C (relative to 100 g of component A) | | 20 | 20 | 0 | 0.9 | — |
| Heat resistant composite | Physical properties | Initial contact angle | 6 | 5 | 28 | 10 | 78 |
| | | Initial haze value | 0.4 | 0.4 | 1.1 | 0.8 | 0.4 |
| | | Appearance | ○ | ○ | ○ | ○ | ○ |
| | | Appearance after heat resistance test | ○ | ○ | Δ | Δ | X |
| | | Haze value after heat resistance test | 0.5 | 0.5 | 2.1 | 2.2 | 24 |

PC: Polycarbonate resin apparatus (manufactured by NPC) in condition 1 (degassed at 150° C. for 5 minutes, subjected to a vacuum lamination process for 10 minutes at a pressure of 100 kPa) to obtain a functional composite. The evaluation results are shown in Table 10.

Examples 55 and 56

A coating composition was obtained in the same manner as in Example 54 except that the composition was changed as shown in Table 10. The obtained coating composition was applied onto a substrate (5 cm×5 cm) formed of polycarbonate resin and having a thickness of 3 mm by dip coating and then dried at 70° C. for 10 minutes to obtain a coating film. Furthermore, a heat treatment was applied to the coating film in condition 2 (heating in air, at 150° C. for 30 minutes) in place of condition 1 to obtain a functional composite. The evaluation results are shown in Table 10.

Comparative Example 5

Only a polycarbonate resin serving as a substrate was used. Evaluation was performed in the same manner as in Example 1 except that the composition was changed as shown in Table 10. The evaluation results are shown in Table 10.

plating with aluminum on the rear (lower) surface of a glass plate) by dip coating so as to obtain a predetermined thickness after drying. Subsequently, the dip coated mirror was dried at 70° C. for 30 minutes to obtain a laminate.

Note that a laminate was prepared in the same manner as above except that the substrate was changed from a reflecting mirror to a white crown glass plate (thickness 2 mm, 6×6 cm squares) and subjected to measurement of haze.

Example 58

A laminate was prepared in the same manner as in Example 57 by using a coating composition blended in the same manner as in Example 57 except that the thickness of a coating film was changed as shown in Table 11. Furthermore, a coating composition was applied onto the coating film of the laminate by dip coating and dried at 70° C. for 30 minutes to obtain a laminate having a plurality of coating film layers.

Example 59

A laminate was prepared in the same manner as in Example 57 by using a coating composition blended in the same manner as in Example 57 except that the composition

TABLE 10

| (parts by mass) | | | Examples | | | Comparative Example |
|---|---|---|---|---|---|---|
| | | | 54 | 55 | 56 | 5 |
| | Substrate | | PC | PC | PC | PC |
| HB-1 | Particle size | 70 nm | 100 | 100 | 100 | — |
| Colloidal silica A | Particle size | 10 nm | 150 | 150 | 150 | — |
| Content of aqueous-phase component | (%) | | 18 | 18 | 18 | — |
| Tetraethoxysilane C (relative to 100 g of component A) | | | 12 | 12 | 12 | — |
| Post-treatment condition | | | 1 | 2 | None | None |
| Functional composite | Physical properties | Initial contact angle | 12 | 12 | 6 | 78 |
| | | Initial haze value | 0.4 | 0.4 | 0.4 | 0.4 |
| | | Appearance | ○ | ○ | ○ | — |
| | | Appearance after solvent resistance test | ◎ | ○ | Δ | X |
| | | Surface hardness | 2H | H | HB | F |

As shown in Table 10, it was demonstrated that the composites of Examples are excellent at least in hydrophilicity, transparency, appearance after solvent resistance test and surface hardness.

Laminate Production; Table 11

Example 57

Colloidal silica (trade name "SNOWTEX-OS" (component (A)) manufactured by Nissan Chemical Industries, Ltd.) was diluted with water to prepare a fluid dispersion having a 10 mass % solid content (number average particle size of 8 nm). To this, a water dispersion of each of polymer emulsion particles synthesized in Production Examples, was blended and component (C):
tetraethoxysilane (trade name "KBE-04" manufactured by Shin-Etsu Chemical Co., Ltd.) was blended so as to satisfy the composition shown in Table 11, and balanced with pure water such that the total solid content was 4 mass % to obtain a coating composition.

The resultant coating composition was applied onto the surface of glass surface of a reflecting mirror (formed by was changed to that shown in Table 11 except that the thickness of the coating film was changed to that shown in Table 11.

Example 60

A laminate was prepared in the same manner as in Example 59 by using a coating composition blended in the same manner as in Example 59 except that the thickness of the coating film was changed as shown in Table 11. Subsequently, the surface of the coating film was rubbed 100 times by sandpaper (#1000) with the application of a load of 22 g/cm². Thereafter, on the coating film having a rubbed surface, a coating composition was applied by dip coating and dried at 70° C. for 30 minutes to obtain a laminate having a plurality of coating film layers.

Comparative Example 6

A reflecting mirror alone serving as a substrate was used.
Evaluation results of Examples and Comparative Examples are shown in Table 11.

TABLE 11

|  |  | Examples | | | | Comparative Example |
|---|---|---|---|---|---|---|
|  |  | 57 | 58 | 59 | 60 | 6 |
| | Refractive index of substrate | 1.51 | 1.51 | 1.51 | 1.51 | 1.51 |
| Coating film | Colloidal silica A (Particle size: 8 nm) | 200 | 200 | 200 | 200 | — |
| | HB-9 (Particle size: 90 nm) | 100 | 100 | 100 | 100 | — |
| | Content of aqueous-phase component (%) | 5 | 5 | 5 | 5 | — |
| | Tetraethoxysilane C (relative to 100 g of component A) | 107 | 107 | 160 | 160 | — |
| | First layer from substrate side — Thickness (nm) | 252 | 245 | 250 | 245 | — |
| | First layer from substrate side — Refractive index | 1.44 | 1.44 | 1.47 | 1.47 | — |
| | Second layer from substrate side — Thickness (nm) | — | 230 | — | 240 | — |
| | Second layer from substrate side — Refractive index | — | 1.44 | — | 1.47 | — |
| | Total thickness of coating film (nm) | 252 | 475 | 250 | 485 | — |
| | Difference in refractive index between coating film and substrate | 0.07 | 0.07 | 0.04 | 0.04 | — |
| Physical properties | Contact angle | 6 | 7 | 5 | 6 | 38 |
| | Reflectivity | 90.5 | 90.6 | 90.9 | 90.8 | 90.8 |
| | Haze value | 0.6 | 0.5 | 0.4 | 0.5 | — |
| | Appearance | ○ | ○ | ○ | ○ | — |

As shown in Table 11, it was demonstrated that the laminates of Examples are excellent at least in hydrophilicity, reflectivity, transparency and appearance.

Study on Laminate, Transmittance; Tables 12, 13

Example 61

"SNOWTEX OS" (component (A)) (trade name, manufactured by Nissan Chemical Industries, Ltd.) was diluted with water to prepare a fluid dispersion (solid content: 10 mass %, number average particle size: 8 nm). To this, the polymer emulsion (HB1) synthesized in Production Example 1 was blended and tetraethoxysilane (C) (trade name "KBE-04" manufactured by Shin-Etsu Chemical Co., Ltd.) was blended in accordance with the composition shown in Table 12 to obtain a coating composition.

The obtained coating composition was applied by spin coating onto a white crown glass plate (thickness: 2 mm, 6×6 cm squares) so as to obtain a film thickness of 250 nm and dried at 70° C. for 30 minutes to obtain a laminate.

Example 62

A laminate was formed using the coating composition so as to satisfy the composition described in Table 12 in the same manner as in Example 61. Thereafter, the coating composition was applied in the same manner to form a layer on the laminate. In this manner, a multi-layer laminate was obtained.

Example 63

A laminate was obtained in the same manner as in Example 61 except that a coating liquid was prepared in accordance with the formulation shown in Table 12.

Example 64

A layer was repeatedly formed on the laminate in the same procedure as in Example 61 to obtain a laminate having 10 layers formed of the coating composition.

Example 65

After a single layer formed of the coating composition was stacked in the same manner as in Example 61, a surface of the coating film was rubbed 10 times by steel wool (#7448) with the application of a load of 22 g/cm². Thereafter, a single layer formed of the coating composition was again stacked to obtain a laminate.

Example 66

A laminate was obtained in the same manner as in Example 61 except that a substrate was changed to a polycarbonate resin named "IUpilon" (thickness: 3 mm, 5×5 cm squares) manufactured by Mitsubishi Engineering-Plastics Corporation.

Comparative Example 7

The evaluation results of only a white crown glass plate serving as a substrate are shown in Table 13.

Comparative Example 8

The evaluation results of only a polycarbonate resin serving as a substrate are shown in Table 13.

Comparative Example 9

"SNOWTEX OS" (component (A)) (trade name, manufactured by Nissan Chemical Industries, Ltd.) was diluted with water to prepare a fluid dispersion (solid content: 10 mass %, number average particle size: 8 nm). To this, a polymer emulsion synthesized in a Production Example was blended in accordance with the composition shown in Table 13 and 30 parts of methyltrimethoxysilane (C) (trade name "KBM-13" manufactured by Shin-Etsu Chemical Co., Ltd.) were added to obtain a coating composition.

The resultant coating composition was applied onto a white crown glass plate (thickness: 2 mm, 6×6 cm squares) so as to obtain a film thickness of 250 nm by spin coating and then dried at 70° C. for 30 minutes to obtain a laminate.

Comparative Example 10

Coating was further repeated onto the laminate obtained in Comparative Example 9 in the same manner. However, a two-layer laminate was not obtained since a coating liquid was repelled.

Evaluation results of Examples and Comparative Examples are shown in Tables 12 and 13.

TABLE 12

| (parts by mass) | | | | Examples 61 | 62 | 63 | 64 | 65 | 66 |
|---|---|---|---|---|---|---|---|---|---|
| Coating film | Substrate (*) | | | Glass | Glass | Glass | Glass | Glass | PC |
| | Refractive index | | | 1.51 | 1.51 | 1.51 | 1.51 | 1.51 | 1.58 |
| | Colloidal silica A | Particle size | 8 nm | 200 | 200 | 200 | 200 | 200 | 200 |
| | HB-1 | Particle size | 70 nm | 100 | 100 | 100 | 100 | 100 | 100 |
| | Content of aqueous phase component | (%) | | 18 | 18 | 18 | 18 | 18 | 18 |
| | Tetraethoxysilane C (relative to 100 g of component A) | | | 0 | 0 | 107 | 107 | 107 | 107 |
| | First layer | Film thickness | nm | 220 | 220 | 250 | 250 | 250 | 280 |
| | | Refractive index | | 1.41 | 1.41 | 1.39 | 1.39 | 1.39 | 1.39 |
| | Second layer | Film thickness | nm | — | 220 | 250 | 250 | 250 | 300 |
| | | Refractive index | | — | 1.41 | 1.39 | 1.39 | 1.39 | 1.39 |
| | Tenth layer | Film thickness | nm | — | — | — | 250 | — | — |
| | | Refractive index | | — | — | — | 1.39 | — | — |
| | Total film thickness | | nm | 220 | 440 | 500 | 2500 | 500 | 580 |
| | Difference in refractive index | | | 0.1 | 0.1 | 0.12 | 0.12 | 0.12 | 0.19 |
| Physical properties | Contact angle | | | 5.2 | 5 | 3.9 | 8.5 | 5 | 14.8 |
| | Total light transmittance | | | 92.84 | 93.14 | 94.08 | 93.36 | 93.73 | 90.24 |
| | Haze value | | | 0.2 | 0.18 | 0.23 | 0.85 | 0.66 | 1.49 |
| | Appearance | | | ○ | ○ | ○ | ○ | ○ | ○ |

*Glass: white crown glass,
PC: polycarbonate

TABLE 13

| (parts by mass) | | | | Comparative Example 7 | 8 | 9 | 10 |
|---|---|---|---|---|---|---|---|
| Coating film | Substrate (*) | | | Glass | PC | Glass | Glass |
| | Refractive index | | | 1.51 | 1.58 | 1.51 | 1.51 |
| | Colloidal silica A | Particle size | 8 nm | — | — | 200 | 200 |
| | HB-1 | Particle size | 70 nm | — | — | 0 | 0 |
| | Content of aqueous-phase component | (%) | | — | — | — | — |
| | Tetraethoxysilane C (relative to 100 g of component A) | | | — | — | 240 | 240 |
| | First layer | Film thickness | nm | — | — | 300 | 300 |
| | | Refractive index | | — | — | 1.44 | 1.44 |
| | Second layer | Film thickness | nm | — | — | — | — |
| | | Refractive index | | — | — | — | — |
| | Tenth layer | Film thickness | nm | — | — | — | — |
| | | Refractive index | | — | — | — | — |
| | Total film thickness | | nm | — | — | 300 | — |
| | Difference in refractive index | | | — | — | 0.07 | — |
| Physical properties | Contact angle | | | 35 | 80 | 73 | — |
| | Total light transmittance | | | 92.51 | 89.23 | 93.93 | — |
| | Haze value | | | 0.12 | 0.51 | 0.07 | — |
| | Appearance | | | — | — | ○ | X |

*Glass: white crown glass,
PC: polycarbonate

As shown in Tables 12 and 13, it was demonstrated that the laminates of Examples are excellent at least in hydrophilicity, transparency and appearance. In contrast, it was demonstrated that the laminates of Comparative Examples are inferior in at least one of hydrophilicity, transparency and appearance.

Study on Aqueous Coating Composition (Titanium Oxide Used in Combination); Table 14

Examples 67 to 69

Colloidal silica (trade name "SNOWTEX-OS" (component (A)) manufactured by Nissan Chemical Industries, Ltd.) was diluted with water to prepare a fluid dispersion having a 10 mass % solid content (a number average particle size of 8 nm). To this, a photocatalyst (trade name "TSK-5" manufactured by Ishihara Sangyo Kaisha, Ltd., a number average particle size: 10 nm, silica coated titanium oxide hydro sol) (component (A3)) and a water dispersion of a polymer emulsion particle synthesized in a Production Example were blended in accordance with the composition shown in Table 14 to obtain a coating composition. The obtained coating composition was applied onto a white crown glass plate (thickness: 2 mm, 6×6 cm squares) by spin coating so as to obtain a film thickness of 250 nm and dried at 70° C. for 30 minutes to obtain a laminate consisting of the white crown glass plate serving as a substrate and a coating film formed thereon.

Examples 70 and 71

A coating composition was obtained in the same manner as in Example 67 except that tetraethoxysilane (trade name "KBE-04" manufactured by Shin-Etsu Chemical Co., Ltd.,) was further added as a component (C) in accordance with the composition shown in Table 14. A laminate was obtained in the same manner as in Example 67 except that the coating composition was used.

Example 72

A coating composition was obtained in the same manner as in Example 67 except that blending was made so as to obtain the composition described in Table 14. A laminate was obtained in the same manner as in Example 67 except that the coating composition was used.

The results of Examples and Comparative Examples are shown in Table 14.

TABLE 14

| (parts by mass) | | | Examples 67 | Examples 68 | Examples 69 |
|---|---|---|---|---|---|
| Colloidal silica A1 | Particle size | 8 nm | 100 | 200 | 200 |
| Titanium oxide sol A3 | Particle size | 10~30 nm | 5 | 5 | 10 |
| HB-1 | Particle size | 70 nm | 100 | 100 | 100 |
| Content of low-molecular weight substance | (%) | | 18 | 18 | 18 |
| Tetraethoxysilane C (relative to 100 g of component A) | | | 0 | 0 | 0 |
| A1/(A1 + A3) | | Mass ratio | 95.3/100 | 97.6/100 | 95.3/100 |
| C/A1 | | Mass ratio | 0/100 | 0/100 | 0/100 |
| Initial | | Contact angle | 12 | 7 | 8 |
| | | Haze value | 0.67 | 0.33 | 0.4 |
| | | Refractive index | 1.4 | 1.4 | 1.43 |
| After weather resistance test | | Contact angle | 15 | 10 | 8 |
| After heating test | | Contact angle | 30 | 25 | 20 |

| (parts by mass) | | | Examples 70 | Examples 71 | Examples 72 |
|---|---|---|---|---|---|
| Colloidal silica A1 | Particle size | 8 nm | 200 | 200 | 100 |
| Titanium oxide sol A3 | Particle size | 10~30 nm | 3 | 5 | 0 |
| HB-1 | Particle size | 70 nm | 100 | 100 | 100 |
| Content of low-molecular weight substance | (%) | | 18 | 18 | 18 |
| Tetraethoxysilane C (relative to 100 g of component A) | | | 107 | 107 | 0 |
| A1/(A1 + A3) | | Mass ratio | 98.5/100 | 97.6/100 | 0/100 |
| C/A1 | | Mass ratio | 50/100 | 50/100 | 0/100 |
| Initial | | Contact angle | 7 | 6 | 13 |
| | | Haze value | 0.6 | 0.65 | 0.5 |
| | | Refractive index | 1.46 | 1.47 | 1.39 |
| After weather resistance test | | Contact angle | 7 | 5 | 22 |
| After heating test | | Contact angle | 18 | 17 | 38 |

As shown in Table 14, it was demonstrated that the laminates of Examples are excellent at least in initial hydrophilicity, transparency and refractive index; at the same time, excellent in hydrophilicity after the weather resistance test and the heating test.

Study on Functional Coating Film; Table 15

Example 73

"SNOWTEX-OS" (component (A)) (trade name manufactured by Nissan Chemical Industries, Ltd.) was diluted with water to prepare a fluid dispersion having a 10 mass % solid content (number average particle size of 8 nm). To this, a polymer emulsion synthesized in a Production Example was blended in accordance with the formulation shown in Table 15 to obtain a coating composition.

The obtained coating composition was applied onto a white crown glass plate (thickness: 2 mm, 6×6 cm squares) by spin coating so as to obtain a film thickness of 250 nm and dried at 70° C. for 30 minutes to obtain a functional coating film.

Example 74

A functional coating film was obtained in the same manner as in Example 74 except that a coating composition was obtained in accordance with the formulation shown in Table 15.

Example 75

A functional coating film was obtained in the same manner as in Example 74 except that a coating composition was obtained in accordance with the formulation shown in Table 15.

Example 76

"SNOWTEX-OS" (component (A)) (trade name manufactured by Nissan Chemical Industries, Ltd.) was diluted with water to prepare a fluid dispersion having a 10 mass % solid content (number average particle size of 8 nm). To this, a polymer emulsion synthesized in a Production Example was blended and tetraethoxysilane (C) (trade name "KBE-04" manufactured by Shin-Etsu Chemical Co., Ltd.,) was blended in accordance with the formulation shown in Table 15 to obtain a coating composition.

The obtained coating composition was applied onto a white crown glass plate (thickness: 2 mm, 6×6 cm squares) by spin coating so as to obtain a film thickness of 250 nm and dried at 70° C. for 30 minutes to obtain a functional coating film.

Example 77

A functional coating film was obtained in the same manner as in Example 74 except that a coating composition was obtained in accordance with the formulation shown in Table 15.

Example 78

A functional coating film was obtained in the same manner as in Example 74 except that a coating composition was obtained in accordance with the formulation shown in Table 15.

Comparative Example 11

Evaluation was made by using only a glass plate serving as a substrate.

temperature of the reaction vessel at 80° C. Subsequently, a solution mixture of butyl acrylate (150 g), tetraethoxysilane (30 g), phenyltrimethoxysilane (145 g) and 3-methacryloxypropyltrimethoxysilane (1.3 g) and a solution mixture of diethylacrylamide (165 g), acrylic acid (3 g), a reactive emulsifier (trade name "ADEKA REASOAP SR-1025", manufactured by ADEKA Corporation, an aqueous solution containing 25 mass % solid content) (13 g), a 2 mass % aqueous ammonium persulfate solution (40 g) and ion-exchanged water (1900 g) were simultaneously added dropwise over about two hours while keeping the temperature of the reaction vessel at 80° C. Furthermore, as heat curing stirring was subsequently performed for about 15 hours while keeping the temperature of the reaction vessel at 80° C. Thereafter, the temperature of the reaction vessel was cooled to room temperature and filtration was performed by a 100 mesh wire netting to obtain a water dispersion of the polymer emulsion particle (TB-1) having a solid content of 14.03 mass %, an aqueous-phase component of 2.76 mass % and having a number average particle size of 131 nm.

The water dispersion of the polymer emulsion particle (TB-1) was filtrated by use of an ultrafiltration apparatus to obtain a filtrate (H-1) containing the aqueous-phase component. The obtained filtrate (H-1) was applied onto a soda lime glass plate (5×5 cm squares) by dip coating and then dried at 90° C. for 24 hours to obtain a film-form test plate (I-1). A deionized water drop was placed on the film surface

TABLE 15

| (parts by mass) | | | Examples | | | | | | Comparative Example |
|---|---|---|---|---|---|---|---|---|---|
| | | | 73 | 74 | 75 | 76 | 77 | 78 | 11 |
| Colloidal silica A | Particle size | 8 nm | 100 | 100 | 200 | 200 | 200 | 50 | — |
| HB-2 | Particle size | 100 nm | 10 | 0 | 0 | 0 | 0 | 0 | — |
| HB-1 | Particle size | 70 nm | 0 | 100 | 100 | 100 | 100 | 100 | — |
| Content of aqueous-phase component | (%) | | 18 | 18 | 18 | 18 | 18 | 18 | |
| Tetraethoxysilane C (relative to 100 g of component A) | | | 0 | 0 | 0 | 160 | 107 | 0 | — |
| Functional coating film Physical properties | Film thickness | nm | 500 | 500 | 500 | 500 | 500 | 500 | 0 |
| | Refractive index | | 1.35 | 1.37 | 1.4 | 1.41 | 1.39 | 1.49 | 1.51 |
| | Contact angle | ° | 4.8 | 20 | 5.2 | 3.9 | 5.9 | 60 | 92.5 |
| | Total light transmittance | % | 94.5 | 94.3 | 93.9 | 94.1 | 93.7 | 92.7 | — |
| | Circle equivalent diameter | nm | 30 | 80 | 200 | 300 | 300 | 5 | — |
| | Porosity | % | 60 | 29 | 13 | 36 | 17 | 2 | — |

As shown in Table 15, it was demonstrated that the laminates of Examples are excellent in refractive index, transparency and appearance.

Production Example 12

Synthesis of Water Dispersion of Polymer Emulsion Particle (TB-1)

To a reaction vessel having a reflux condenser, a dropping tank, a thermometer and a stirrer, ion-exchanged water (1600 g) and dodecyl benzene sulfonic acid (4 g) were supplied, and heated to increase the temperature to 80° C. under stirring. To this, a solution mixture of dimethyldimethoxysilane (185 g) and phenyltrimethoxysilane (117 g) was added dropwise over about two hours while keeping the temperature of the reaction vessel at 80° C. and thereafter stirring was continued for about one hour while keeping the of the test plate (I-1) thus obtained and allowed to stand still at 20° C. for 10 seconds. The initial contact angle as then measured was 57°.

Production Example 13

Synthesis of Water Dispersion of Polymer Emulsion Particle (TB-2)

Polymerization was performed in the same method as in Synthesis Example 1 and the heat curing time described in Production Example 12 was set to be 8 hours to obtain a water dispersion of the polymer emulsion particle (TB-2) having a solid content of 14.05 mass %, an aqueous-phase component of 4.57 mass % and a number average particle size of 132 nm.

The water dispersion of the polymer emulsion particle (TB-2) was filtrated by use of an ultrafiltration apparatus to obtain a filtrate (H-2) containing the aqueous-phase component. The obtained filtrate (H-2) was applied onto a soda lime glass plate (5×5 cm squares) by dip coating and then dried at 90° C. for 24 hours to obtain a film-form test plate (I-2). A deionized water drop was placed on the film surface of the test plate (I-2) thus obtained and allowed to stand still at 20° C. for 10 seconds. The initial contact angle as then measured was 56°.

Production Example 14

Synthesis of Water Dispersion of Polymer Emulsion Particle (TB-3)

Polymerization was Performed in the Same Method as in Synthesis Example 1 and the heat curing time described in Production Example 12 was set to be 4 hours to obtain a water dispersion of the polymer emulsion particle (TB-3) having a solid content of 14.08 mass %, an aqueous-phase component of 8.91 mass % and a number average particle size of 131 nm.

The water dispersion of the polymer emulsion particle (TB-3) was filtrated by use of an ultrafiltration apparatus to obtain a filtrate (H-3) containing the aqueous-phase component. The obtained filtrate (H-3) was applied onto a soda lime glass plate (5×5 cm squares) by dip coating and then dried at 90° C. for 24 hours to obtain a film-form test plate (I-3). A deionized water drop was placed on the film surface of the test plate (I-3) thus obtained and allowed to stand still at 20° C. for 10 seconds. The initial contact angle as then measured was 58°.

Production Example 15

Polymerization was performed in the same method as in Synthesis Example 1 and the heat curing time described in Production Example 12 was set to be 3.5 hours to obtain a water dispersion of a polymer emulsion particle (TB-4) having a solid content of 14.02 mass %, an aqueous-phase component of 11.46 mass % and a number average particle size of 131 nm.

The water dispersion of the polymer emulsion particle (TB-4) was filtrated by use of an ultrafiltration apparatus to obtain a filtrate (H-4) containing the aqueous-phase component. The obtained filtrate (H-4) was applied onto a soda lime glass plate (5×5 cm squares) by dip coating and then dried at 90° C. for 24 hours to obtain a film-form test plate (I-4). A deionized water drop was placed on the film surface of the test plate (I-4) thus obtained and allowed to stand still at 20° C. for 10 seconds. The initial contact angle as then measured was 57°.

Production Example 16

Synthesis of Water Dispersion of Polymer Emulsion Particle (TB-5)

Polymerization was performed in the same method as in Synthesis Example 1 and the heat curing time described in Production Example 12 was set to be 3 hours to obtain a water dispersion of the polymer emulsion particle (TB-5) having a solid content of 14.05 mass %, an aqueous-phase component of 14.12 mass % and a number average particle size of 130 nm.

The water dispersion of the polymer emulsion particle (TB-5) was filtrated by use of an ultrafiltration apparatus to obtain a filtrate (H-5) containing the aqueous-phase component. The obtained filtrate (H-5) was applied onto a soda lime glass plate (5×5 cm squares) by dip coating and then dried at 90° C. for 24 hours to obtain a film-form test plate (I-5). A deionized water drop was placed on the film surface of the test plate (I-5) thus obtained and allowed to stand still at 20° C. for 10 seconds. The initial contact angle as then measured was 57°.

Production Example 17

Polymerization was performed in the same method as in Synthesis Example 1 and the heat curing time described in Production Example 12 was set to be 2.5 hours to obtain a water dispersion of the polymer emulsion particle (TB-6) having a solid content of 14.07 mass %, an aqueous-phase component of 16.34 mass % and a number average particle size of 130 nm.

The water dispersion of the polymer emulsion particle (TB-6) was filtrated by use of an ultrafiltration apparatus to obtain a filtrate (H-6) containing the aqueous-phase component. The obtained filtrate (H-6) was applied onto a soda lime glass plate (5×5 cm squares) by dip coating and then dried at 90° C. for 24 hours to obtain a film-form test plate (I-6). A deionized water drop was placed on the film surface of the test plate (I-6) thus obtained and allowed to stand still at 20° C. for 10 seconds. The initial contact angle as then measured was 58°.

Production Example 18

Synthesis of Water Dispersion of Polymer Emulsion Particle (TB-7)

Polymerization was performed in the same method as in Synthesis Example 1 and the heat curing time described in Production Example 12 was set to be 2 hours to obtain a water dispersion of the polymer emulsion particle (TB-7) having a solid content of 14.06 mass %, an aqueous-phase component of 18.19 mass % and a number average particle size of 129 nm.

The water dispersion of the polymer emulsion particle (TB-7) was filtrated by use of an ultrafiltration apparatus to obtain a filtrate (H-7) containing the aqueous-phase component. The obtained filtrate (H-7) was applied onto a soda lime glass plate (5×5 cm squares) by dip coating and then dried at 90° C. for 24 hours to obtain a film-form test plate (I-7). A deionized water drop was placed on the film surface of the test plate (I-7) thus obtained and allowed to stand still at 20° C. for 10 seconds. The initial contact angle as then measured was 57°.

Production Example 19

Synthesis of Water Dispersion of Polymer Emulsion Particle (TB-8)

Polymerization was performed in the same method as in Synthesis Example 1 and the heat curing time described in Production Example 12 was set to be one hour to obtain a water dispersion of the polymer emulsion particle (TB-8) having a solid content of 14.09 mass %, an aqueous-phase component of 21.93 mass % and a number average particle size of 130 nm.

The water dispersion of the polymer emulsion particle (TB-8) was filtrated by use of an ultrafiltration apparatus to obtain a filtrate (H-8) containing the aqueous-phase component. The obtained filtrate (H-8) was applied onto a soda lime glass plate (5×5 cm squares) by dip coating and then dried at 90° C. for 24 hours to obtain a film-form test plate (I-8). A deionized water drop was placed on the film surface of the test plate (I-8) thus obtained and allowed to stand still at 20° C. for 10 seconds. The initial contact angle as then measured was 56°.

Production Example 20

Synthesis of Water Dispersion of Polymer Emulsion Particle (TB-9)

Polymerization was performed in the same method as in Synthesis Example 1 and the heat curing described in Production Example 12 was not performed to obtain a water dispersion of the polymer emulsion particle (TB-9) having a solid content of 14.11 mass %, an aqueous-phase component of 28.66 mass % and a number average particle size of 128 nm.

The water dispersion of the polymer emulsion particle (TB-9) was filtrated by use of an ultrafiltration apparatus to obtain a filtrate (H-9) containing the aqueous-phase component. The obtained filtrate (H-9) was applied onto a soda lime glass plate (5×5 cm squares) by dip coating and then dried at 90° C. for 24 hours to obtain a film-form test plate (I-9). A deionized water drop was placed on the film surface of the test plate (I-9) thus obtained and allowed to stand still at 20° C. for 10 seconds. The initial contact angle as then measured was 58°.

Example 79

To the water dispersion of the polymer emulsion particle (TB-1) (100 g) synthesized in Production Example 12, 100 g of water-dispersed colloidal silica (trade name "SNOWTEX O", manufactured by Nissan Chemical Industries, Ltd., solid content: 20 mass %) having a number average particle size of 12 nm was blended and stirred to obtain an aqueous organic/inorganic composite composition (E-1).

The aqueous organic/inorganic composite composition (E-1) was applied onto a soda lime glass plate (5×5 cm squares) by bar coating so as to obtain a film thickness of 1 μm and thereafter dried at 70° C. for 30 minutes to obtain a test plate (G-1) having an organic/inorganic composite film (F-1). The initial contact angle of the obtained test plate (G-1) having an organic/inorganic composite film with water was 7.2°.

Example 80

A test plate (G-2) having an organic/inorganic composite film (F-2) was obtained by the same method as in Example 79 except that the water dispersion of the polymer emulsion particle (TB-2) synthesized in Production Example 13 was used in place of the polymer emulsion particle (TB-1). The initial contact angle of the obtained test plate (G-2) having an organic/inorganic composite film with water was 7.2°.

Example 81

A test plate (G-3) having an organic/inorganic composite film (F-3) was obtained by the same method as in Example 79 except that the water dispersion of the polymer emulsion particle (TB-3) synthesized in Production Example 14 was used in place of the polymer emulsion particle (TB-1). The initial contact angle of the obtained test plate (G-3) having an organic/inorganic composite film with water was 7.2°.

Example 82

A test plate (G-4) having an organic/inorganic composite film (F-4) was obtained by the same method as in Example 79 except that the water dispersion of the polymer emulsion particle (TB-4) synthesized in Production Example 15 was used in place of the polymer emulsion particle (TB-1). The initial contact angle of the obtained test plate (G-4) having an organic/inorganic composite film with water was 7.2°.

Example 83

A test plate (G-5) having an organic/inorganic composite film (F-5) was obtained by the same method as in Example 79 except that the water dispersion of the polymer emulsion particle (TB-5) synthesized in Production Example 16 was used in place of the polymer emulsion particle (TB-1). The initial contact angle of the obtained test plate (G-5) having an organic/inorganic composite film with water was 7.2°.

Example 84

A test plate (G-6) having an organic/inorganic composite film (F-6) was obtained by the same method as in Example 79 except that the water dispersion of the polymer emulsion particle (TB-6) synthesized in Production Example 17 was used in place of the polymer emulsion particle (TB-1). The initial contact angle of the obtained test plate (G-6) having an organic/inorganic composite film with water was 7.2°.

Example 85

A test plate (G-7) having an organic/inorganic composite film (F-7) was obtained by the same method as in Example 79 except that the water dispersion of the polymer emulsion particle (TB-7) synthesized in Production Example 18 was used in place of the polymer emulsion particle (TB-1). The initial contact angle of the obtained test plate (G-7) having an organic/inorganic composite film with water was 7.2°.

Comparative Example 12

A test plate (G-8) having an organic/inorganic composite film (F-8) was obtained by the same method as in Example 79 except that the water dispersion of the polymer emulsion particle (TB-8) synthesized in Production Example 19 was used in place of the polymer emulsion particle (TB-1). The initial contact angle of the obtained test plate (G-8) having an organic/inorganic composite film with water was 7.2°.

Comparative Example 13

A test plate (G-9) having an organic/inorganic composite film (F-9) was obtained by the same method as in Example 79 except that the water dispersion of the polymer emulsion particle (TB-9) synthesized in Production Example 20 was used in place of the polymer emulsion particle (TB-1). The initial contact angle of the obtained test plate (G-9) having an organic/inorganic composite film with water was 7.2°.

The results of Examples and Comparative Examples are shown in Table 16.

TABLE 16

| | Heat curing time (hr) | Content of aqueous-phase component (mass %) | Contact angle after high-temperature/high-humidity test (°) | Initial contact angle (°) |
|---|---|---|---|---|
| Example 79 | 15 | 2.76 | 11 | 7 |
| Example 80 | 8 | 4.57 | 13 | 7 |
| Example 81 | 4 | 8.91 | 15 | 7 |
| Example 82 | 3.5 | 11.46 | 23 | 7 |
| Example 83 | 3 | 14.12 | 31 | 7 |
| Example 84 | 2.5 | 16.34 | 42 | 7 |
| Example 85 | 2 | 18.19 | 47 | 7 |
| Comparative Example 12 | 1 | 21.93 | 52 | 7 |
| Comparative Example 13 | 0 | 28.66 | 55 | 7 |

As shown in Table 16, it was demonstrated that the coating films of Examples can maintain surface hydrophilicity at least even at high temperature/high humidity.

The present application is based on Japanese Patent Application No. 2009-058665 filed on Mar. 11, 2009 with the Japanese Patent Office, Japanese Patent Application No. 2009-270364 filed on Nov. 27, 2009 with the Japanese Patent Office, Japanese Patent Application No. 2009-270375 filed on Nov. 27, 2009 with the Japanese Patent Office and Japanese Patent Application No. 2010-045505 filed on Mar. 2, 2010 with the Japanese Patent Office and the contents thereof are incorporated herein by reference.

INDUSTRIAL APPLICABILITY

The coating film and coating composition according to the present invention are excellent in antifouling properties, transparency, hydrophilicity and durability (shock resistance) and maintain surface hydrophilicity even at high temperature/high humidity and thus used as a member of various energy production apparatuses and the like such as a solar cell module and a solar thermal power generation system, and can be preferably used as a member having excellent transmittance of sunlight and sunlight harvesting properties such as a protective member of a solar cell and a member of a light reflecting mirror for solar thermal power generation.

REFERENCE SIGNS LIST

1 . . . Laminate
10 . . . Substrate
12 . . . Coating film
2 . . . Solar cell module
20 . . . Protective member
22 . . . Backsheet
24 . . . Power generating element
26 . . . Sealant
202 . . . Substrate
204 . . . Coating film
3 . . . Reflector device
30 . . . Laminate (protective member)
32 . . . Light reflecting mirror
34 . . . Support

The invention claimed is:

1. A method for manufacturing a laminate comprising a substrate and coating film in contact with at least one surface of the substrate, the method comprising:
applying a coating composition to at least one surface of a substrate to from a coating film, and
subjecting the coating film at least one of a thermal treatment at 70° C. or more and a pressurization treatment at 0.1 kPa or more,
wherein the coating composition comprises
a component (A): comprises metal oxide particle having a number average particle size of 1 nm to 400 nm, and
a component (B): comprises a polymer particle,
wherein a content of an aqueous-phase component in the component (B), represented by the following expression (I), is 20 mass % or less:

the content of the aqueous-phase component (%)= (dry mass of a filtrate obtained by filtering the component (B) at a molecular cutoff of 50,000)×(100−total mass of solid content)/(mass of the filtrate−dry mass of the filtrate)×100/the total mass of solid content      (I).

2. The method according to claim 1, wherein in the coating composition the component (B) is a polymer emulsion particle (B1) obtained, in a polymerization material solution comprising
a component (b1): a hydrolyzable silicon compound,
a component (b2): a vinyl monomer,
a component (b3): an emulsifier, and
a component (b4): water,
by polymerizing the component (b1) and the component (b2).

3. The method according to claim 1, wherein the content of the aqueous-phase component is 15 mass % or less.

4. The method according to claim 1, wherein the component (B) has a number average particle size of 10 nm to 800 nm.

5. The method according to claim 2, wherein the component (b2) is a vinyl monomer having at least one functional group selected from the group consisting of a hydroxy group, a carboxyl group, an amide group, an amino group and an ether group.

6. The method according to claim 2, wherein a mass ratio ((b2)/(B)) of the component (b2) to the component (B) is 0.01/1 to 1/1.

7. The method according to claim 2, wherein a mass ratio ((b2)/(A)) of the component (b2) to the component (A) is 0.01/1 to 1/1.

8. The method according to claim 1, wherein the component (B) has a core/shell structure comprising a core layer and one or two or more shell layers covering the core layer.

9. The method according to claim 8, wherein a mass ratio ((b2)/(b1)) of the component (b2) to the component (b1) in the core layer is 0.01/1 to 1/1, and the mass ratio ((b2)/(b1)) of the component (b2) to the component (b1) in an outermost layer of the shell layers is 0.01/1 to 5/1.

10. The method according to claim 8, wherein the component (B) is a polymer emulsion particle obtained by polymerizing the polymerization material solution in the presence of a seed particle forming the core layer, and the seed particle is obtained by polymerizing at least one component selected from the group consisting of a component (b1): a hydrolyzable silicon compound, the component (b2): a vinyl monomer, and a component (b5): a different vinyl monomer copolymerizable with the component (b2).

11. The method according to claim 2, wherein the component (b2) is a vinyl monomer having a secondary amide group, a tertiary amide group or both.

12. The method according to claim 1, wherein a mass ratio ((A)/(B)) of the component (A) to the component (B) is 110/100 to 480/100.

13. The method according to claim 1, wherein the coating composition further comprises a component (C): at least one hydrolyzable silicon compound selected from the group consisting of compounds represented by the following formulas (1), (2) and (3):

$$R^1{}_n SiX_{4-n} \qquad (1)$$

wherein $R^1$ represents a hydrogen atom, an alkyl, alkenyl or alkynyl group having 2 to 10 carbon atoms, or an aryl group and optionally having a halogen group, a hydroxy group, a mercapto group, an amino group, a (meth)acryloyl group or an epoxy group; X represents a hydrolyzable group; and n is an integer of 0 to 3;

$$X_3Si-R^2{}_n-SiX_3 \qquad (2)$$

wherein X represents a hydrolyzable group; $R^2$ represents an alkylene group having 2 to 6 carbon atoms or phenylene group; and n is 0 or 1;

$$R^3-(O-Si(OR^3)_2)_n-OR^3 \qquad (3)$$

wherein $R^3$ represents an alkyl group having 1 to 6 carbon atoms; and n is an integer of 2 to 8.

14. The method according to claim 13, wherein a mass ratio ((C)/(A)) of the component (C) to the component (A) is 1/100 to 150/100.

15. The method according to claim 1, wherein the component (B) has a number average particle size of 10 nm to 100 nm.

16. The method according to claim 1, wherein the component (A) comprises
   a component (A1): silica having a number average particle size of 1 nm to 400 nm, and
   a component (A2): an infrared absorbent having a number average particle size of 1 nm to 2000 nm;
   a mass ratio ((A1+A2)/(B)) of a total content of the component (A1) and the component (A2) to a content of the component (B) is 60/100 to 1000/100; and
   a mass ratio ((A2)/(A1+B)) of the content of the component (A2) to a total content of the component (B) and the component (A1) is 0.05/100 to 40/100.

17. The method according to claim 1, wherein the component (A) comprises
   a component (A1): silica having a number average particle size of 1 nm to 400 nm, and
   a component (A3): a photocatalyst having a number average particle size of 1 nm to 2000 nm;
   a mass ratio ((A1+A3)/(B)) of a total content of the component (A1) and the component (A3) to a content of the component (B) is 60/100 to 480/100; and
   a mass ratio ((A1)/(A1+A3)) of a content of the component (A1) to the total content of the component (A1) and the component (A3) is 85/100 to 99/100.

* * * * *